(12) United States Patent
Choi

(10) Patent No.: US 12,550,558 B2
(45) Date of Patent: Feb. 10, 2026

(54) DISPLAY DEVICE AND METHOD OF PROVIDING THE SAME

(71) Applicant: Samsung Display Co., LTD., Yongin-si (KR)

(72) Inventor: Myung-Wook Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 505 days.

(21) Appl. No.: 18/191,952

(22) Filed: Mar. 29, 2023

(65) Prior Publication Data

US 2024/0090282 A1 Mar. 14, 2024

(30) Foreign Application Priority Data

Sep. 13, 2022 (KR) .......................... 10-2022-0114846

(51) Int. Cl.
| | |
|---|---|
| *H10K 59/131* | (2023.01) |
| *H10K 59/12* | (2023.01) |
| *H10K 59/121* | (2023.01) |
| *H10K 59/124* | (2023.01) |
| *H10K 59/40* | (2023.01) |
| *H10K 59/80* | (2023.01) |
| *H10K 71/16* | (2023.01) |

(52) U.S. Cl.
CPC ....... *H10K 59/131* (2023.02); *H10K 59/1201* (2023.02); *H10K 59/1213* (2023.02); *H10K 59/124* (2023.02); *H10K 59/40* (2023.02); *H10K 59/873* (2023.02); *H10K 71/166* (2023.02)

(58) Field of Classification Search
CPC . H10K 59/131; H10K 59/1201; H10K 59/124
USPC ........................................................... 257/40
See application file for complete search history.

(56) References Cited

U.S. PATENT DOCUMENTS

| | | | | |
|---|---|---|---|---|
| 2021/0028241 A1* | 1/2021 | Kim | ................. | H10D 86/60 |
| 2022/0406817 A1* | 12/2022 | Park | ................. | H10H 20/84 |
| 2024/0038956 A1* | 2/2024 | Lee | ................. | H01L 25/167 |

FOREIGN PATENT DOCUMENTS

| | | |
|---|---|---|
| KR | 1020150033444 A | 4/2015 |
| KR | 1020190054049 A | 5/2019 |
| KR | 1020210002285 A | 1/2021 |

* cited by examiner

*Primary Examiner* — Xia L Cross
(74) *Attorney, Agent, or Firm* — CANTOR COLBURN LLP

(57) ABSTRACT

A display device includes a display area including a light emitting device, a driving element, an encapsulation layer covering the light emitting device and a touch sensing layer on the encapsulation layer, a pad area adjacent to the display area and including a connection pad comprising first through fourth conductive layers and a connection wiring which is electrically connected to the connection pad, the connection wiring including first and second wiring layers, and an insulating layer in the pad area and defining both a cladding layer covering a side surface of the third conductive layer of the connection pad and having a first thickness, and a wiring insulating layer covering the second wiring layer of the connection wiring and having a second thickness greater than the first thickness of the cladding layer.

20 Claims, 20 Drawing Sheets

DISPLAY DEVICE AND METHOD OF PROVIDING THE SAME

This application claims priority to Korean Patent Application No. 10-2022-0114846, filed on Sep. 13, 2022, and all the benefits accruing therefrom under 35 U.S.C. § 119, the content of which in its entirety is herein incorporated by reference.

BACKGROUND

1. Field

Embodiments of the invention relate to a display device and method of manufacturing (or providing) the display device.

2. Description of the Related Art

A display device may include a plurality of pixels, and the pixels may be driven by signals received from an external component such as a driving chip, a circuit film, or the like to display an image. The display device may include connection pads at which the display device is connected to the driving chip, the circuit film, etc., and connection wirings connecting the connection pads to each other or connecting the connection pads and the pixels to each other.

SUMMARY

When impurities such as moisture flow into the connection pads at which the display device is connected to a component such as the driving chip, the circuit film, etc., from the outside of the display device or the component through a insulating layer, the connection pads may be damaged or the driving chip which is connected to the connection pads may be separated from a display panel of the display device. In addition, in the process of etching metal to form electrodes on the connection wirings which connect the connection pads to each other or connect the connection pads and the pixels to each other, the wirings may be damaged.

Embodiments provide a display device with improved reliability.

Embodiments provide a method of manufacturing the display device with improved reliability.

A display device according to an embodiment includes a base substrate including a display area and a pad area including a first area and a second area surrounding the first area, a light emitting device disposed in the display area on the base substrate, a driving device electrically connected to the light emitting device, an encapsulation layer covering the light emitting device, a touch sensing part disposed on the encapsulation layer, a connection pad disposed in the first area on the base substrate and including a first conductive layer, a second conductive layer disposed on the first conductive layer, a third conductive layer disposed on the second conductive layer, and a fourth conductive layer disposed on the third conductive layer, a connection wiring disposed in the second area on the base substrate, connected to the connection pad, and including a first wiring layer and a second wiring layer disposed on the first wiring layer, a cladding layer covering a side surface of the third conductive layer of the connection pad and having a first thickness, and a wiring insulating layer covering the second wiring layer of the connection wiring and having a second thickness greater than the first thickness of the cladding layer.

In an embodiment, the driving device may include a gate metal pattern including a gate electrode, a first source metal pattern including a drain electrode, and a second source metal pattern including a connection electrode connecting the drain electrode and the light emitting device, and the touch sensing part may include a sensing conductive pattern.

In an embodiment, the cladding layer and the wiring insulating layer may be integrally formed with a via insulating layer covering the second source metal pattern, and a thickness of the via insulating layer may be equal to the second thickness of the wiring insulating layer.

In an embodiment, the first conductive layer may include the same material as the gate metal pattern, the second conductive layer may include the same material as the first source metal pattern, the third conductive layer may include the material as the second source metal pattern, and the fourth conductive layer may include the same material as the sensing conductive pattern.

In an embodiment, the first wiring layer may be integrally formed with the second conductive layer, and the second wiring layer may be integrally formed with the third conductive layer.

In an embodiment, the touch sensing part may include a first touch insulating layer, a first sensing conductive pattern disposed on the first touch insulating layer, a second touch insulating layer covering the first sensing conductive pattern, and a second sensing conductive pattern disposed on the second touch insulating layer, and the fourth conductive layer may include the same material as the second sensing conductive pattern.

In an embodiment, the display device may further include a passivation layer including the same material as the first touch insulating layer or the second touch insulating layer and covering the cladding layer.

In an embodiment, driving device may include a gate metal pattern including a gate electrode, a first source metal pattern including a drain electrode, a second source metal pattern including a connection electrode connecting the drain electrode and the light emitting device and a horizontal connection pattern to which a data voltage is applied, and a third source metal pattern including a vertical connection pattern electrically connected to the horizontal connection pattern, and the touch sensing part may include a sensing conductive pattern.

In an embodiment, the cladding layer and the wiring insulating layer may be integrally formed with a via insulating layer covering the third source metal pattern, and a thickness of the via insulating layer may equal to the second thickness of the wiring insulating layer.

In an embodiment, the first conductive layer may include the same material as the gate metal pattern, the second conductive layer may include the same material as the second source metal pattern, the third conductive layer may include the material as the third source metal pattern, and the fourth conductive layer may include the same material as the sensing conductive pattern.

In an embodiment, the connection wiring may further include a third wiring layer disposed under the first wiring layer, and the third wiring layer may include the same material as the first source metal pattern.

A display device according to an embodiment includes a base substrate including a display area and a pad area including a first area and a second area surrounding the first area, a pixel array disposed in the display area on the base substrate, a connection pad disposed in the first area on the base substrate and including a first conductive layer, a second conductive layer disposed on the first conductive layer, a third conductive layer disposed on the second conductive layer, and a fourth conductive layer disposed on the third conductive layer, a connection wiring disposed in the second area on the base substrate, connected to the connection pad, and including a first wiring layer and a second wiring layer disposed on the first wiring layer, a cladding layer covering a side surface of the third conductive layer of the connection pad and having a first thickness, and a wiring insulating layer covering the second wiring layer of the connection wiring and having a second thickness greater than the first thickness of the cladding layer.

In an embodiment, the pixel array may include a light emitting device and a driving device electrically connected to the light emitting device, the driving device may include a gate metal pattern including a gate electrode, a first source metal pattern including a drain electrode, and a second source metal pattern including a connection electrode connecting the drain electrode and the light emitting device, the first conductive layer may include the same material as the gate metal pattern, the second conductive layer may include the same material as the first source metal pattern, and the third conductive layer may include the material as the second source metal pattern.

In an embodiment, the cladding layer and the wiring insulating layer may be integrally formed with a via insulating layer covering the second source metal pattern, and a thickness of the via insulating layer may be equal to the second thickness of the wiring insulating layer.

In an embodiment, the first wiring layer may be integrally formed with the second conductive layer, and the second wiring layer may be integrally formed with the third conductive layer.

A method of manufacturing (or providing) a display device according to an embodiment includes forming (or providing) a first conductive layer in a first area on a base substrate including a display area and a pad area including the first area and a second area surrounding the first area, forming a second conductive layer electrically contacting the first conductive layer in the first area on the base substrate, and forming a first wiring layer connected to the second conductive layer in the second area on the base substrate, forming a third conductive layer electrical contacting the second conductive layer in the first area on the base substrate, and forming a second wiring layer connected to the third conductive layer in the second area on the base substrate, forming a cladding layer covering a side surface of the third conductive layer and having a first thickness in the first area on the base substrate, and forming a wiring insulating layer covering the second wiring layer and having a second thickness greater than the first thickness of the cladding layer in the second area on the base substrate, and forming a fourth conductive layer electrically contacting the third conductive layer in the first area on the base substrate.

In an embodiment, the display device may include a light emitting device disposed in the display area on the base substrate and a driving device electrically connected to the light emitting device, the first conductive layer may be formed together with a gate metal pattern including a gate electrode of the driving device, the second conductive layer and the first wiring layer may be formed together with a first source metal pattern including a drain electrode of the driving device, and the third conductive layer and the second wiring layer may be formed together with a second source metal pattern including a connection electrode connecting the drain electrode and the light emitting device.

In an embodiment, the display device may further include an encapsulation layer covering the light emitting device and a touch sensing part disposed on the encapsulation layer and including a sensing conductive pattern, and the fourth conductive layer is formed together with the sensing conductive pattern.

In an embodiment, the cladding layer and the wiring insulating layer may be integrally formed with a via insulating layer covering the second source metal pattern, and a thickness of the via insulating layer is equal to the second thickness of the wiring insulating layer.

In an embodiment, the cladding layer, the wiring insulating layer, and the via insulating layer may be formed together using a halftone mask.

Therefore, the display device according to embodiments may include a cladding layer and a wiring insulating layer formed in a pad area, the cladding layer may cover at least a portion of a conductive layer of a connection pad, and the wiring insulating layer may cover a wiring layer of a connection wiring. Accordingly, damage to the connection pad and the connection wiring due to an etching process may be minimized or prevented. In addition, the cladding layer and the wiring insulating layer may be integrally formed, and the thickness of the wiring insulating layer may be greater than the thickness of the cladding layer. Accordingly, defects in a process of connecting the connection pad and the integrated circuit may be prevented, and damage to the connection wiring may be minimized or prevented. Accordingly, the reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
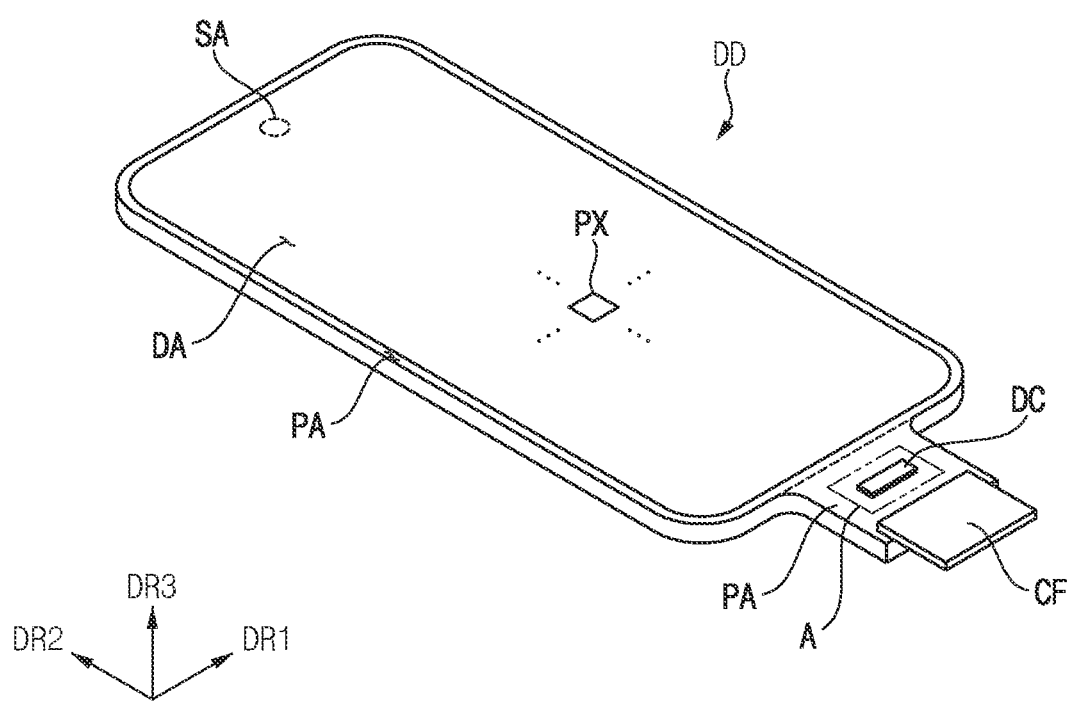
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." Herein, a reference number labeling a singular form of an element within the figures may be used to reference a plurality of the singular element within the text of the disclosure.

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device DD according to an embodiment.

Referring to FIG. 1, the display device DD may include a display area DA and a peripheral area PA. The display area DA may display an image or be a planar area at which the image is displayed. The display area DA may include or be disposed in a plane defined by the first direction DR1 and the second direction DR2 which crosses the first direction DR1, such as being orthogonal to the first direction DR1 but not limited thereto. That is, the display device DD may display an image in (or along) the third direction DR3 crossing each of the first direction DR1 and the second direction DR2, such as being perpendicular to the plane, through the display area DA. A plurality of pixels as a display element may be disposed in the display area DA.

The plurality of pixels may generate and/or emit light based on signals (e.g., electrical) transmitted from a component in the peripheral area PA. Each of the plurality of pixels may include a light emitting device and a driving device for driving the light emitting device. The driving device may be connected to the light emitting device for driving the light emitting device. For example, the display device DD may be an organic light emitting display device, and the light emitting device may be an organic light emitting diode.

According to an embodiment, the display device DD may further include an encapsulation layer 220 for protecting the organic light emitting diode and a touch sensing part (as a touch sensing layer) which is disposed on the encapsulation layer 220.

In an embodiment, a sensing area SA may be defined in the display area DA. The sensing area SA may occupy a planar area of the overall planar area of the display area DA. For example, the sensing area SA may be a portion of the display area DA. The sensing area SA may display an image, transmit an external input provided to an electronic module of the display device DD which provides a function thereof and/or transmit an output provided from the electronic module to an external area (e.g. outside of the display device DD). In an embodiment, the electronic module may provide the function using a light, a heat, a proximity, a contact, etc. provided from an input tool. The electronic module may be a camera module, a sensor for measuring a distance, a sensor for recognizing a part of an input tool such as a user's body, or a small lamp for outputting light, but the invention is not necessarily limited thereto.

The sensing area SA may have higher transmittance than other areas in the display area DA. Transmittance may include light transmittance, without being limited thereto.

Although FIG. 1 illustrates that one sensing area SA is defined in the display area DA, the number of the sensing area SA is not necessarily limited thereto.

The peripheral area PA may be located adjacent to the display area DA, in a direction along the display device DD (or the plane), such as being around the display area DA in a plan view (e.g., a view along the third direction DR3). For example, the peripheral area PA may surround the display area DA. Elements which provide the signals transmitted to the display area DA for displaying an image may be disposed in the peripheral area PA.

The peripheral area PA may include a pad area SBA. The display device DD and or various components or layers thereof may be bendable, foldable, etc. at the pad area SBA. The display device DD may include a bending area corresponding to the pad area SBA, without being limited thereto. In a completed product like a finished display device DD, the pad area SBA may be bent and located on a rear surface of the display device DD. In other words, the pad area SBA may not be visually recognized from a front surface of a completed display device DD which is bent at the pad area SBA. A driving chip DC and a circuit film CF may be disposed in the pad area SBA. The driving chip DC and the circuit film CF may be connected to the pad area SBA by a conductive film. The driving chip DC and the circuit film CF may generate and transmit the signals transmitted to the plurality of pixels in the display area DA. That is, the pad area SBA, the driving chip DC, the circuit film CF, etc. may be connected to the display area DA. In an embodiment, the driving chip DC may include an integrated circuit.

Various components or layers of the display device DD may have a display area, DA, a peripheral area PA, a sensing area SA, a pad area SBA, etc. corresponding to those described above. The display device DD and various components or layers thereof may have a thickness defined along a thickness direction (e.g., the third direction DR3).

In an embodiment, the driving chip DC may have a form or structure to be disposed in a chip-on-plastic (COP) method or a chip-on-glass (COG) method. In an embodiment, the circuit film CF may be a flexible printed circuit board (FPCB). The circuit film CF may have a form or structure to be disposed in a film-on-plastic (FOP) method or a film-on-glass (FOG) method.

Figure 2:
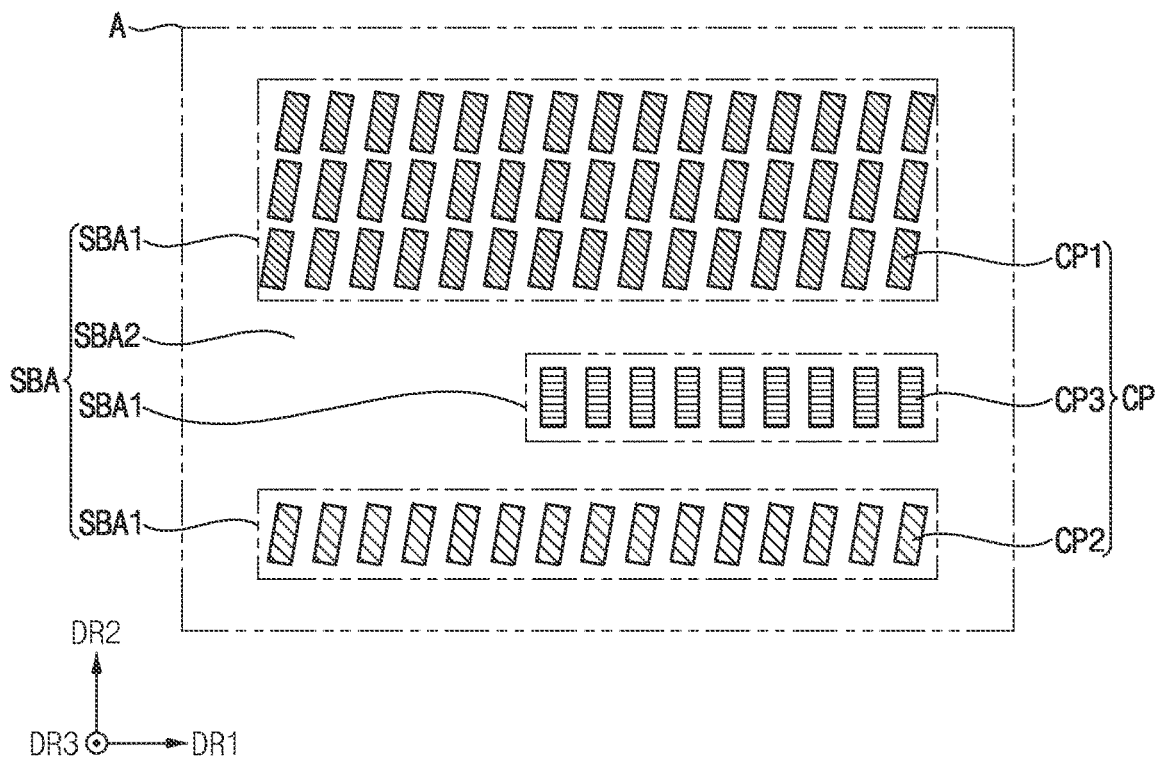
FIGS. 2 and 3 are enlarged views schematically enlarging an area 'A' of the display device of FIG. 1.
Figure 3:
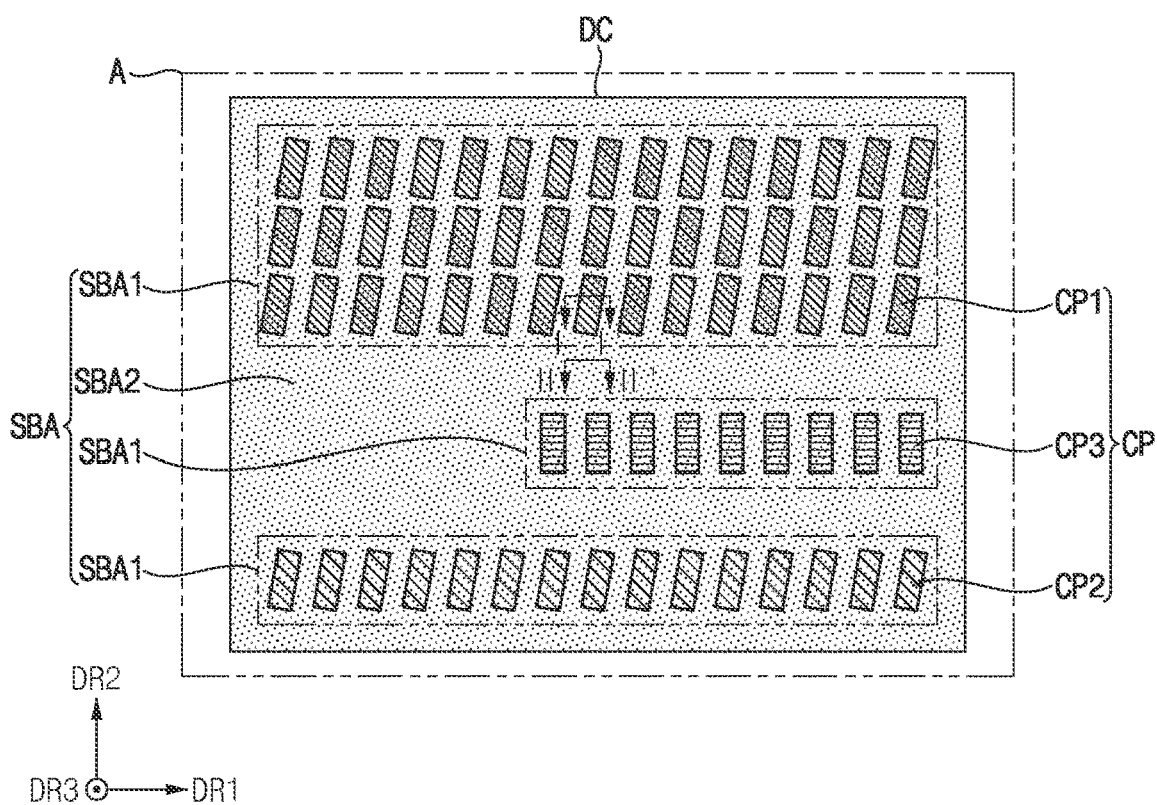

FIGS. 2 and 3 are enlarged views schematically enlarging an area 'A' of the display device of FIG. 1.

Referring to FIGS. 1 and 2, the pad area SBA may include a plurality of first areas SBA1 and a plurality of second areas SBA2 which surround the first areas SBA1. A plurality of connection pads CP may be disposed in each of the first areas SBA1 as a connection pad area. Connection wirings WR connected to the plurality of connection pads CP may be disposed in the second area SBA2 to define a connection wiring area. For example, the connection wirings may include wirings connecting the connection pads CP to each other, wirings connecting the connection pads CP and the plurality of pixels to each other, and wirings connecting the connection pads CP and the circuit film CF to each other, or the like.

The plurality of connection pads CP may include first connection pads CP1, second connection pads CP2, and third connection pads CP3. In an embodiment, as shown in FIG. 2, the first connection pads CP1 may be disposed in the one first area SBA1 (e.g., a first sub-area) and the second connection pads CP2 may be disposed in the one first area SBA1 (e.g., a second sub-area), and the third connection pads CP3 may be disposed in the one first area SBA1 (e.g., a third sub-area). In an embodiment, the first connection pads CP1 may be output pads at which an output signal received from the driving chip DC is output from the pad area SBA. The second connection pads CP2 may be input pads at which input signals from the driving chip DC are input to the pad area SBA. Taking FIG. 1 together with FIGS. 2 and 3, the second connection pads CP2 may be further from the display area DA than the first connection pads CP1 and the third connection pads CP3. The third connection pads CP3 may be array test pads. In an embodiment, the third connection pads CP3 may be omitted.

The pad area SBA may include a plurality of pad rows each extending along the first direction DR1. In an embodiment, the first connection pads CP1 may be arranged in a row along the first direction DR1, the second connection pads CP2 may be arranged in a row along the first direction DR1, and the third connection pads CP3 may be arranged in a row along the first direction DR1. For example, as shown in FIG. 2, the first connection pads CP1 may be arranged in three rows, and the second connection pads CP2 and the third connection pads CP3 may be arranged in one row, respectively. However, the invention is not necessarily limited thereto, and in an embodiment, the first connection pads CP1 may be arranged in one or more rows, and the second connection pads CP2 and the third connection pads CP3 may be arranged in two or more rows.

A single connection pad may have a planar shape including a major dimension extending in an extension direction, and a minor dimension extending along a direction crossing the extension direction. In an embodiment, each of the first connection pads CP1 and the second connection pads CP2 may extend to have an extension direction along an oblique direction forming an acute angle with respect to the first direction DR1 and the second direction DR2, respectively. Each of the third connection pads CP3 may extend to have an extension direction along the second direction DR2. For example, each of the first connection pads CP1 and the second connection pads CP2 may have a planar shape of a parallelogram, and each of the third connection pads CP3 may have a planar shape of a rectangle. However, the invention is not necessarily limited thereto, and each of the first connection pads CP1, the second connection pads CP2, and the third connection pads CP3 may have various planar shapes.

In an embodiment, each of the connection pads CP may have a multilayer structure along a thickness direction, including a plurality of conductive layers. For example, each of the connection pads CP may be a combination of conductive layers including the same material as a gate metal pattern and a source metal pattern of the driving device, and a sensing conductive pattern of the touch sensing part. In an embodiment, each of the first connection pads CP1, the second connection pads CP2, and the third connection pads CP3 may have the same stacked structure. That is, one or more layer of the connection pads CP may be in a same layer as a pattern of the driving device and/or a pattern of the touch sensing part. As being in a same layer, elements may be formed in a same process and/or as including a same material as each other, elements may be respective portions or patterns of a same material layer, elements may be on a same layer by forming an interface with a same underlying or overlying layer, etc., without being limited thereto.

Referring to FIG. 1 and FIG. 3 together, the driving chip DC may be disposed on the connection pads CP. The driving chip DC may be connected to the connection pads CP by the conductive film. The driving chip DC may output the output signal generated, through the first connection pads CP1, based on the input signal transmitted through the second connection pads CP2.

Figure 4:
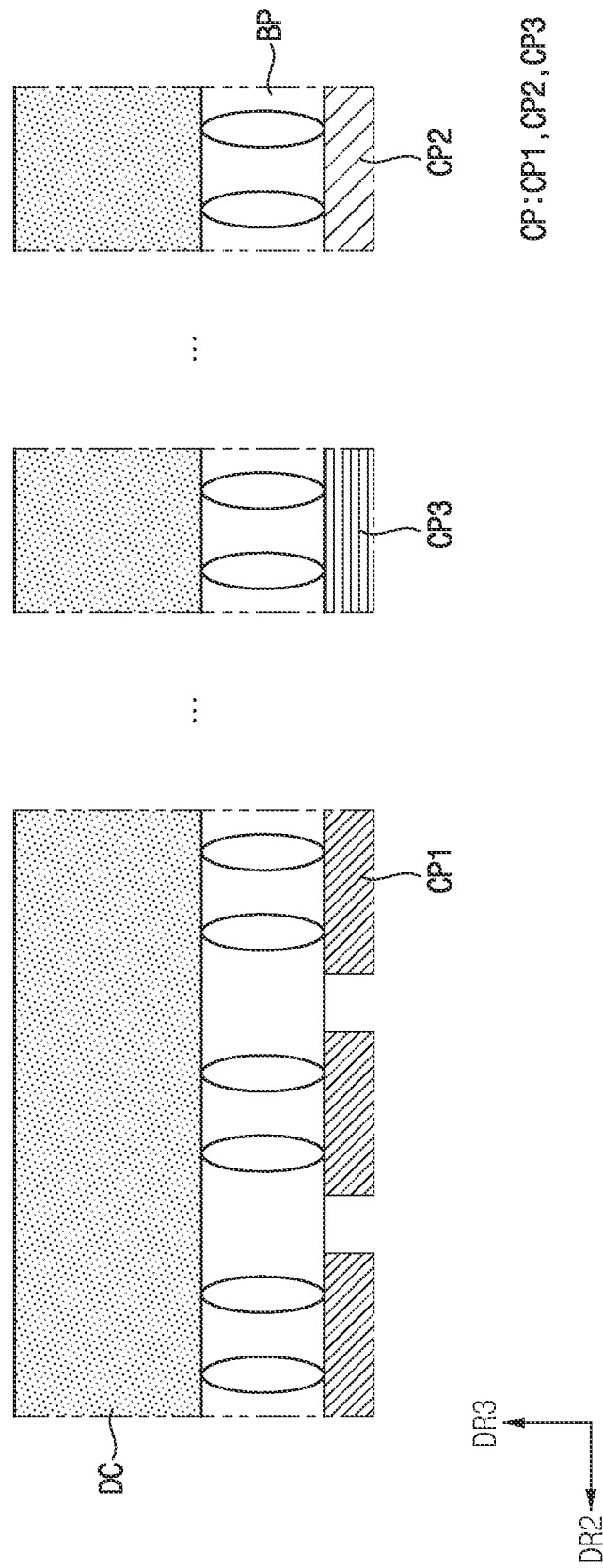
FIG. 4 is a view illustrating an embodiment in which a driver is disposed on connection pads disposed in an area 'A' of the display device of FIG. 1.

FIG. 4 is a view illustrating an embodiment in which a driver represented by the driving chip DC, is disposed on a plurality of connection pads CP disposed in an area 'A' of the display device of FIG. 1.

Referring to FIG. 4, the connection pads CP may be electrically connected to the driving chip DC, through a conductive bonding member BP within a conductive bonding layer. For example, the conductive bonding member BP may be a metal bump. In an embodiment, the conductive bonding member BP may be an anisotropic conductive film as a layer including a conductive ball or other conductive element.

Figure 5:
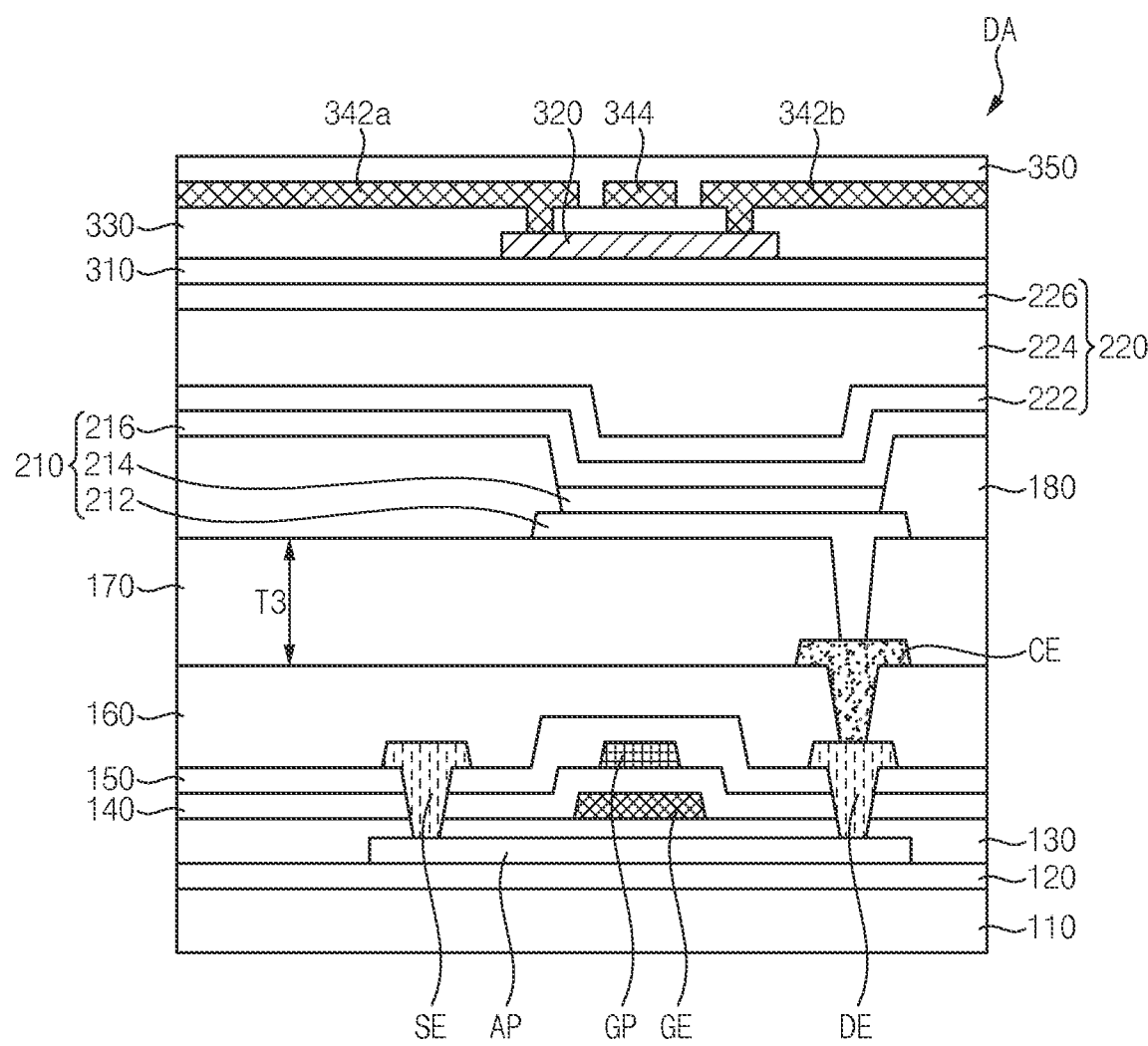
FIG. 5 is a cross-sectional view illustrating a display area of the display device of FIG. 1.
Figure 6:
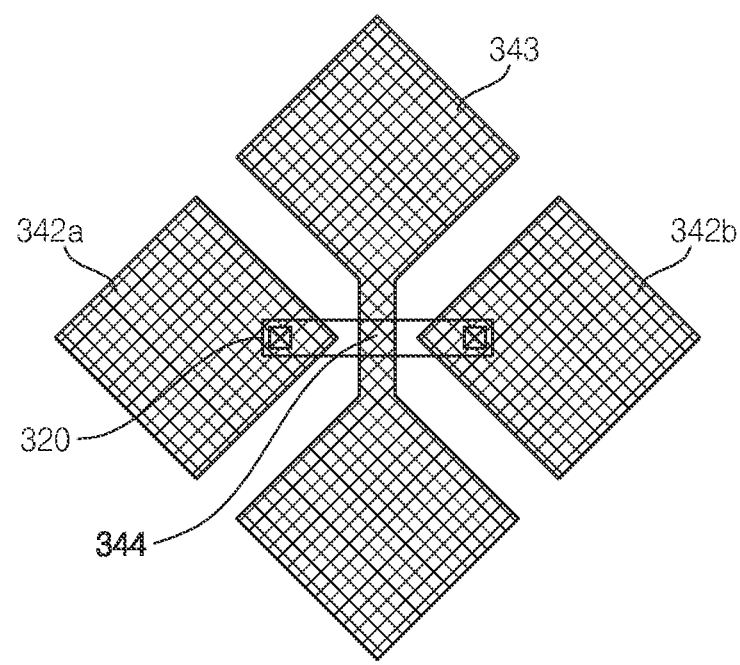
FIG. 6 is a plan view illustrating a sensing electrode of a display device of FIG. 1.

FIG. 5 is a cross-sectional view illustrating a display area DA of the display device DD of FIG. 1, and FIG. 6 is a plan view illustrating a sensing electrode of a display device DD of FIG. 1. In an embodiment, the layered structure in FIG. 5 may represent a pixel among a plurality of pixels arranged in the display area DA, where the plurality of pixels may be arranged to define a pixel array in the display area DA.

Referring to FIG. 5, a buffer layer 120 may be disposed on a base substrate 110, in the display area DA. An active pattern AP of an active layer may be disposed on the buffer layer 120. The gate metal pattern as a portion of a gate metal pattern layer including a gate electrode GE may be disposed on the active pattern AP. A first insulating layer 130 may be disposed between the active pattern AP and the gate electrode GE. The first insulating layer 130 may be referred to as a first gate insulating layer.

A gate wiring pattern GP of a gate wiring layer may be disposed on the gate electrode GE. The gate wiring pattern GP may form an electrode of a capacitor, a signal wiring for transmitting a driving signal, or the like. A second insulating layer 140 may be disposed between the gate electrode GE and the gate wiring pattern GP. A third insulating layer 150 may be disposed on the gate wiring pattern GP.

A first source metal pattern of a first source metal pattern layer including a source electrode SE and a drain electrode DE may be disposed on the third insulating layer 150. The source electrode SE and the drain electrode DE may electrically contact the active pattern AP by penetrating lower insulating layers between the first source pattern layer and the active layer. A fourth insulating layer 160 may be disposed on the first source metal pattern including the source electrode SE and the drain electrode DE. The fourth insulating layer 160 may be referred to as a first via insulating layer. Elements within layers AP through the first source metal pattern may be included in a driving device (or driving element) for driving the light emitting device, and may be otherwise referred to as a transistor, a pixel circuit, etc. Elements within layer 212 through 216 may be included in a light emitting device which is connected to and driven by the driving device, and may be otherwise referred to as a light emitting element. The pixel circuit layer and the light emitting element layer may be included together in a display panel without being limited thereto.

A second source metal pattern of a second source metal pattern layer including a connection electrode CE may be disposed on the fourth insulating layer 160. The connection electrode CE may electrically contact the drain electrode DE. The second source metal pattern may further include a mesh power line (not shown) for compensating for a voltage drop of current provided to the organic light emitting diode. A fifth insulating layer 170 may be disposed on the second source metal pattern. The fifth insulating layer 170 may be referred to as a second via insulating layer.

A light emitting device 210 may be disposed on the fifth insulating layer 170. For example, a first electrode 212 of the light emitting device 210 may be disposed on the fifth insulating layer 170. The first electrode 212 may electrically contact the connection electrode CE. In an embodiment, when the connection electrode CE is omitted, the first electrode 212 may directly electrically contact the drain electrode DE.

An emission layer 214 as a light emitting layer may be disposed on the first electrode 212. In an embodiment, the emission layer 214 may be disposed in an opening of a pixel defining layer 180. The opening defined in the pixel defining layer 180 may correspond to a light emission area of the display area A. The emission layer 214 may be a pattern or discrete shape element. However, the invention is not necessarily limited thereto, and the emission layer 214 may extend along a sidewall of the pixel defining layer 180 which defines the opening, out of the opening and along the upper surface of the pixel defining layer 180. The emission layer 214 may continuously extend over a plurality of pixels within the display area DA.

A second electrode 216 of the light emitting device 210 may be disposed on the emission layer 214. In an embodiment, the second electrode 216 may continuously extend over a plurality of pixels within the display area DA, such as to be commonly disposed in the plurality of pixels.

An encapsulation layer 220 may be disposed on the light emitting device 210. For example, the encapsulation layer 220 may be disposed on the second electrode 216. The encapsulation layer 220 may include at least one inorganic encapsulation layer and at least one organic encapsulation layer. In an embodiment, the encapsulation layer 220 may include a first inorganic encapsulation layer 222 disposed on the second electrode 216, an organic encapsulation layer 224 disposed on the first inorganic encapsulation layer 222, and a second inorganic encapsulation layer 226 disposed on the organic encapsulation layer 224.

The touch sensing part may be disposed on the encapsulation layer 220. For example, the touch sensing part may obtain coordinate information of an external input, by sensing the external input in a capacitive manner. In an embodiment, the touch sensing part may include a first touch insulating layer 310, a first sensing conductive pattern, a second touch insulating layer 330, a second sensing conductive pattern, and a protective layer 350.

The first sensing conductive pattern may be disposed on the first touch insulating layer 310 and include a bridge pattern 320. The second touch insulating layer 330 may be disposed on the first sensing conductive pattern, and the second sensing conductive pattern may be disposed on the second touch insulating layer 330. The protective layer 350 may cover the second sensing conductive pattern.

Referring to FIG. 5 and FIG. 6 together, the second sensing conductive pattern which is on the second touch insulating layer 330 and covered by the protective layer 350 may include a first sensing electrode and a second sensing electrode. The first sensing electrode and the second sensing electrode are electrically insulated from each other. For example, each of an electrode pattern array of the first sensing electrode and an electrode pattern array of the second sensing electrode may extend along directions crossing each other, such as being perpendicular to each other. Portions of the first sensing electrode and portions of the second sensing electrode may be in a same layer as each other and spaced apart from each other along the encapsulation layer 220.

For example, the first sensing electrode of the second sensing conductive pattern may include a first electrode pattern 342a and a second electrode pattern 342b spaced apart from each other. The first electrode pattern 342a and the second electrode pattern 342b may electrically contact the bridge pattern 320 through via holes formed in the second touch insulating layer 330. Thus, the first electrode pattern 342a and the second electrode pattern 342b may be electrically connected to each other.

The second sensing electrode of the second sensing conductive pattern may include a plurality of electrode patterns 343 and a connection part 344 which is disposed on (or in) the same layer as the electrode patterns 343 and continuously connected thereto. The first electrode pattern 342a, the second electrode pattern 342b, the electrode patterns 343 and the connection part 344 may be disposed in a sensing conductive pattern layer.

However, embodiments of the invention are not necessarily limited to the structures shown in FIGS. 5 and 6, and may have various known structures. For example, in an embodiment, the first touch insulating layer 310 may be omitted. Also, electrode patterns adjacent to the first sensing electrode may be connected by a plurality of bridge patterns 320. In addition, the first sensing electrode and the second sensing electrode may be disposed on (or in) different layers, so that the first sensing electrode may have a continuous structure without a bridge pattern 320.

Figure 7A:
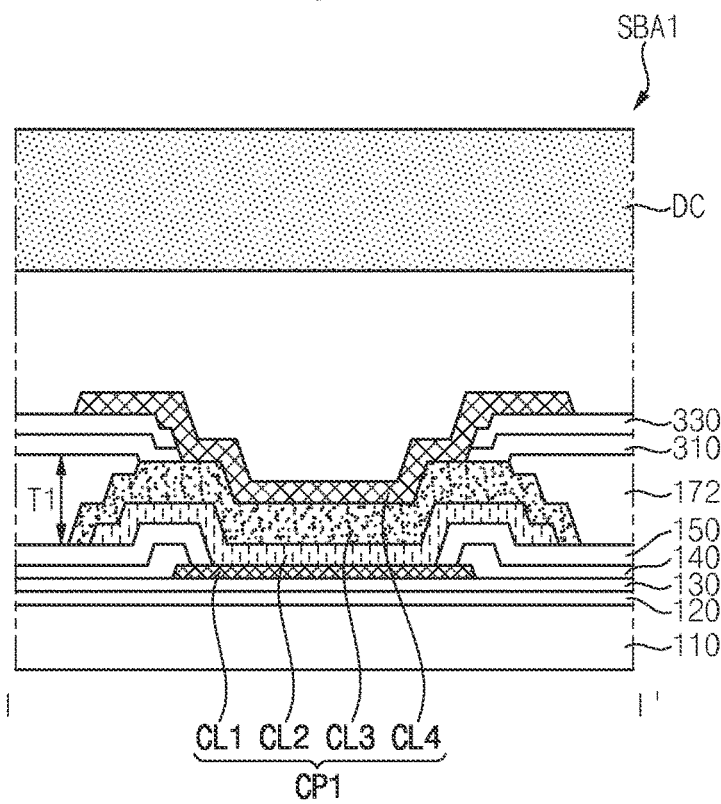
FIGS. 7A and 7B are cross-sectional views respectively illustrating a first area and a second area of the display device of FIG. 3.
Figure 7B:
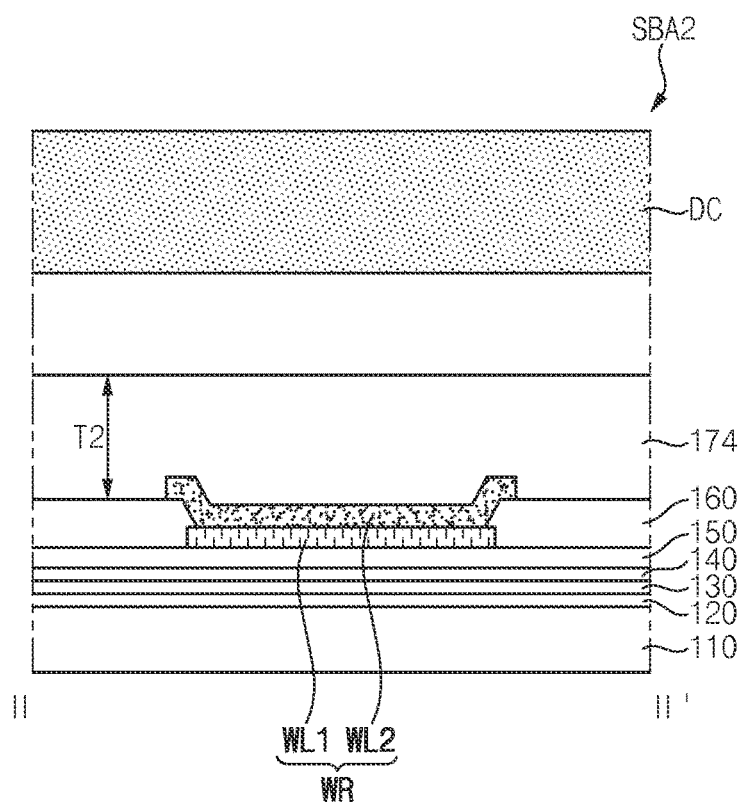

FIGS. 7A and 7B are cross-sectional views respectively illustrating a first area SBA1 and a second area SBA2 of the display device DD of FIG. 3. For example, FIG. 7A is a view illustrating a cross-section taken along line I-I' and FIG. 7B is a view illustrating a cross-section taken along line II-IF of FIG. 3. Hereinafter, FIGS. 7A and 7B may together be referred to as FIG. 7.

Referring to FIGS. 3 and 7, the connection pads CP may be disposed on the base substrate 110, in the first area SBA1. Hereinafter, for convenience of explanation, a structure of the first connection pads CP1, a structure of the second connection pads CP2, and a structure of the third connection pads CP3 will be described through a structure of one of the first connection pads CP1. As described above, each of the first connection pads CP1, the second connection pads CP2, and the third connection pads CP3 may have the same stacked structure along the thickness direction.

In an embodiment, the first connection pad CP1 may include a first conductive layer CL1, a second conductive layer CL2, a third conductive layer CL3, and a fourth conductive layer CL4.

In an embodiment, the first conductive layer CL1 may include the same material as and/or be in a same layer as the gate metal pattern of the display area DA. In other words, the first conductive layer CL1 may be formed together with the gate metal pattern, such that the first conductive layer CL1 and the gate metal pattern are respective patterns of a same material layer. For example, the first conductive layer CL1 may be disposed on the first insulating layer 130. In the first area SBA1, the second insulating layer 140 and the third insulating layer 150 may be disposed to cover both side surface portions of the first conductive layer CL1. The second insulating layer 140 and the third insulating layer 150 may expose a central portion of the first conductive layer CL1 to outside the second insulating layer 140 and the third insulating layer 150 among lower insulating layers. The central portion may define an exposed portion of the first conductive layer CL1.

In an embodiment, the second conductive layer CL2 may include the same material as and/or be in a same layer as the first source metal pattern of the display area DA. In other words, the second conductive layer CL2 may be formed together with the first source metal pattern, such that the second conductive layer CL2 and the first source metal pattern are respective patterns of a same material layer. For example, the second conductive layer CL2 may be disposed on the third insulating layer 150. The second conductive layer CL2 may electrically contact the first conductive layer CL1 exposed from the second insulating layer 140 and the third insulating layer 150.

In an embodiment, the third conductive layer CL3 may include the same material as and/or be in a same layer as the second source metal pattern of the display area DA. In other words, the third conductive layer CL3 may be formed together with the second source metal pattern, such that the third conductive layer CL3 and the second source metal pattern are respective patterns of a same material layer. The third conductive layer CL3 may be disposed on the second conductive layer CL2 and electrically contact the second conductive layer CL2.

In an embodiment, the third conductive layer CL3 may have a multilayer structure including a lower layer, an intermediate layer, and an upper layer in order from the base substrate 110. The lower layer and the upper layer may include a metal having a relatively low ionization tendency, such as titanium, and the intermediate layer which is between the lower and upper layers, may include a metal having a relatively high ionization tendency, such as aluminum.

In an embodiment, a cladding layer 172 covering at least a portion of the third conductive layer CL3 may be disposed in the first area SBA1. In an embodiment, the cladding layer 172 may cover a side surface of the third conductive layer CL3. In an embodiment, the cladding layer 172 may be integrally formed with the fifth insulating layer 170. That is, the cladding layer 172 (refer to the peripheral area of FIG. 1) and the fifth insulating layer 170 (refer to the display area DA of FIG. 5) may be in a same layer as each other, to define respective portion of a same material layer.

In an embodiment, a passivation layer may be disposed on the cladding layer 172. In an embodiment, the passivation layer may include the same material as the first touch insulating layer 310 and/or the second touch insulating layer 330 of the touch sensing part. In other words, the passivation layer may be formed together with the first touch insulating layer 310 and/or the second touch insulating layer 330 of the touch sensing part, to variously include portions of the first touch insulating layer 310 and the second touch insulating layer 330, alone or together with each other. The passivation layer may extend below the fourth conductive layer CL4 to be overlapped by the fourth conductive layer CL4 and be between the third and fourth conductive layers CL3 and CL4.

Referring to FIG. 5 together with FIG. 7A, the first touch insulating layer 310 and/or the second touch insulating layer 330 may extend from the display area DA in the touch sensing part, and into the pad area SBA to define the passivation layer on the various connection pads. Here, a layer indicated in multiple views of the drawings which represent different areas of the display device DD may indicate such layer extends from one area to another (different) area. In an embodiment, a layer among the first touch insulating layer 310 and the second touch insulating layer 330 is in the display area DA and in the pad area SBA, and a portion of the layer defines the passivation layer.

In an embodiment, the fourth conductive layer CL4 may include the same material as the sensing conductive pattern of the touch sensing part. For example, the fourth conductive layer CL4 may include the same material as and/or be in a same layer as the second sensing conductive pattern. In other words, the fourth conductive layer CL4 may be formed together with the second sensing conductive pattern, such that the fourth conductive layer CL4 and the sensing conductive pattern are respective patterns of a same material layer. The fourth conductive layer CL4 may electrically contact the third conductive layer CL3 exposed from the passivation layer and the cladding layer 172.

In the second area SBA2, a connection wiring WR may be disposed on the base substrate 110. In an embodiment, the connection wiring WR may include a first wiring layer WL1 and a second wiring layer WL2.

In an embodiment, the first wiring layer WL1 may be integrally formed with the second conductive layer CL2. In other words, the first wiring layer WL1 may include the same material as the second conductive layer CL2, be in a same layer, etc. In other words, the first wiring layer WL1 may include the same material as the first source metal pattern of the display area DA. For example, the first wiring layer WL1 may be disposed on the third insulating layer 150. In the second area SBA2, the fourth insulating layer 160 may be disposed to cover both side surface portions of the first wiring layer WL1. An opening which is defined in the fourth insulating layer 160 may expose a central portion of the first wiring layer WL1 to outside the fourth insulating layer 160.

In an embodiment, the second wiring layer WL2 may be integrally formed with the third conductive layer CL3. In other words, the second wiring layer WL2 may include the same material as the third conductive layer CL3. In other words, the second wiring layer WL2 may include the same material as the second source metal pattern of the display area DA. For example, the second wiring layer WL2 may be disposed on the fourth insulating layer 160. The second wiring layer WL2 may electrically contact an exposed portion of the first wiring layer WL1 which is exposed from the fourth insulating layer 160.

In an embodiment, a wiring insulating layer 174 covering the second wiring layer WL2 may be disposed in the second area SBA2. In an embodiment, the wiring insulating layer 174 may be integrally formed with the cladding layer 172 and the fifth insulating layer 170. That is, the wiring insulating layer 174 and the fifth insulating layer 170 may be in a same layer as each other, to define respective portion of a same material layer. Since the fifth insulating layer 170 is indicated in the multiple views of FIG. 5, FIG. 7A (as 172) and FIG. 7B (as 174), it may be indicated that the fifth insulating layer 170 extends from one area (like the display area DA) to another (different) area (like the pad area SBA).

In an embodiment, among portions of the same insulating layer (e.g., the fifth insulating layer 170) at locations along the base substrate 110, a first thickness T1 of the cladding layer 172 may be smaller than a second thickness T2 of the wiring insulating layer 174. In other words, the cladding layer 172 and the wiring insulating layer 174 are integrally formed, and the second thickness T2 of the wiring insulating layer 174 disposed in the second area SBA2 may be greater than the first thickness T1 of the cladding layer 172 disposed on the first area SBA1. In this case, in an embodiment, the second thickness T2 of the wiring insulating layer 174 and a third thickness T3 of the fifth insulating layer 170 in the display area DA, may be equal to each other. Herein, a thickness may refer to a maximum thickness of a portion of a respective layer, without being limited thereto.

FIGS. 8 to 17 are cross-sectional views illustrating a method of manufacturing (or providing) the display device DD of FIG. 1.

Figure 8:
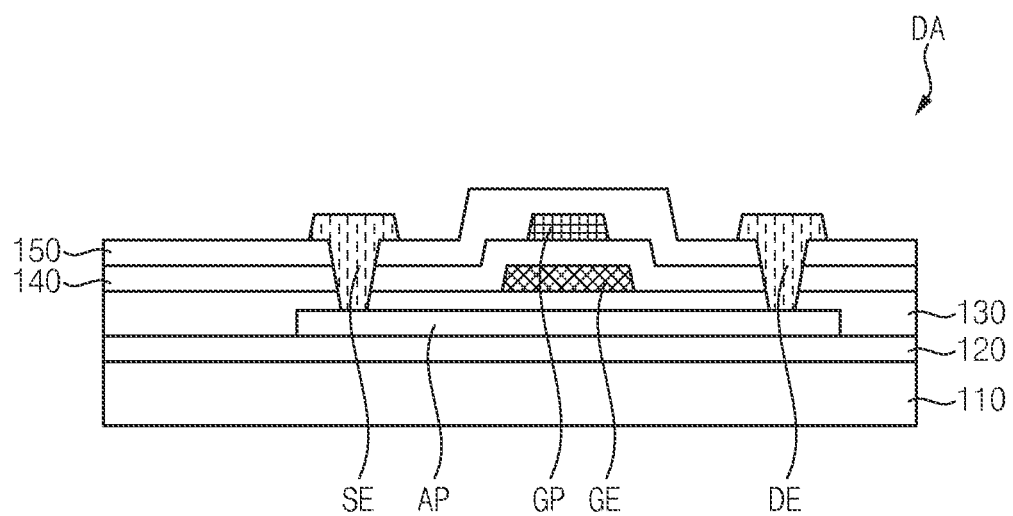
FIGS. 8 to 17B are cross-sectional views illustrating a manufacturing method of the display device of FIG. 1.

Referring to FIG. 8, the buffer layer 120 may be formed (or provided) on the base substrate 110 in the display area DA.

In an embodiment, the base substrate 110 may include a flexible material or a rigid material. For example, the base substrate 110 may include a polymer material such as polyimide, and in this case, the base substrate 110 may have a flexible property. Alternatively, for example, the base substrate 110 may include a material such as glass, and in this case, the base substrate 110 may have rigid property.

The buffer layer 120 may include an inorganic insulating material. Examples of materials that can be used as the buffer layer 120 may include silicon oxide (SiOx), silicon nitride (SiNx), and silicon oxynitride (SiON). These may be used alone or in combination with each other. The buffer layer 120 may prevent metal atoms or impurities from diffusing into the active pattern AP. Also, the buffer layer 120 may control the speed of heat provided to the active pattern AP during a crystallization process for forming the active pattern AP.

Thereafter, an active pattern AP may be formed on the buffer layer 120. In an embodiment, the active pattern AP may include a semiconductor material. For example, the semiconductor material may be a silicon semiconductor or an oxide semiconductor.

Thereafter, the first insulating layer 130 may be formed on the active pattern AP. Thereafter, the gate metal pattern including the gate electrode GE may be formed on the first insulating layer 130, from a first metal pattern layer. The gate electrode GE may overlap the active pattern AP. Thereafter, the second insulating layer 140 may be formed to cover the gate metal pattern layer. Thereafter, the gate wiring pattern GP may be formed on the second insulating layer 140.

In an embodiment, each of the first insulating layer 130 and the second insulating layer 140 may include an inorganic insulating material. Examples of materials that can be used as each of the first insulating layer 130 and the second insulating layer 140 may include silicon oxide (SiOx), silicon nitride (SiNx), and silicon oxynitride (SiON). These may be used alone or in combination with each other.

In an embodiment, each of the gate metal pattern and the gate wiring pattern GP may include a metal, an alloy, a metal oxide, a transparent conductive material, or the like. Examples of materials that can be used as each of the gate metal pattern and the gate wiring pattern GP may include silver (Ag), an alloy containing silver, molybdenum (Mo), an alloy containing molybdenum, and aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

Thereafter, the third insulating layer 150 may be formed on the gate wiring pattern GP. Thereafter, the first source metal pattern may be formed on the third insulating layer 150, from a second metal pattern layer. The first source metal pattern may include the source electrode SE and the drain electrode DE electrically contacting the active pattern AP. For example, each of the source electrode SE and the drain electrode DE may penetrate through the third insulating layer 150, the second insulating layer 140, and the first insulating layer 130 to contact the active pattern AP, electrically.

In an embodiment, the third insulating layer 150 may include an inorganic insulating material. Examples of materials that can be used as the third insulating layer 150 may include silicon oxide (SiOx), silicon nitride (SiNx), and silicon oxynitride (SiON). These may be used alone or in combination with each other.

In an embodiment, the first source metal pattern may include a metal, an alloy, a metal oxide, or a transparent conductive material. Examples of materials that can be used as the first source metal pattern may include silver (Ag), an alloy containing silver, molybdenum (Mo), an alloy containing molybdenum, aluminum (Al), and aluminum containing Alloy, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), indium tin oxide (ITO), indium zinc oxide (IZO), or the like. These may be used alone or in combination with each other. In an embodiment, the second source metal pattern may have a titanium/aluminum two-layer structure or a titanium/aluminum/titanium three-layer structure.

Figure 9A:
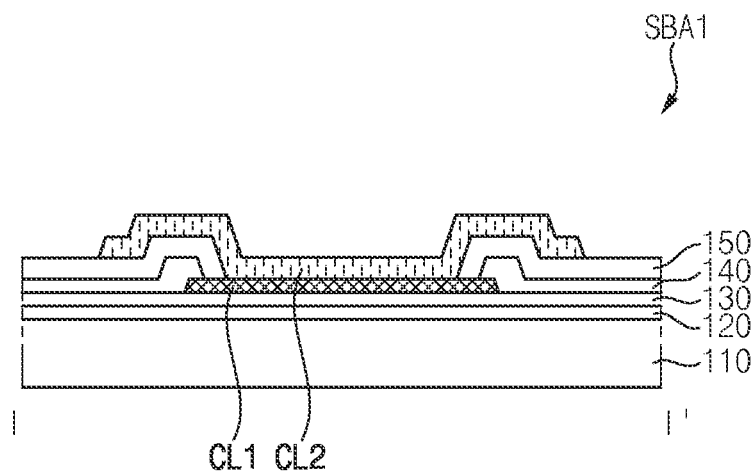
Figure 9B:
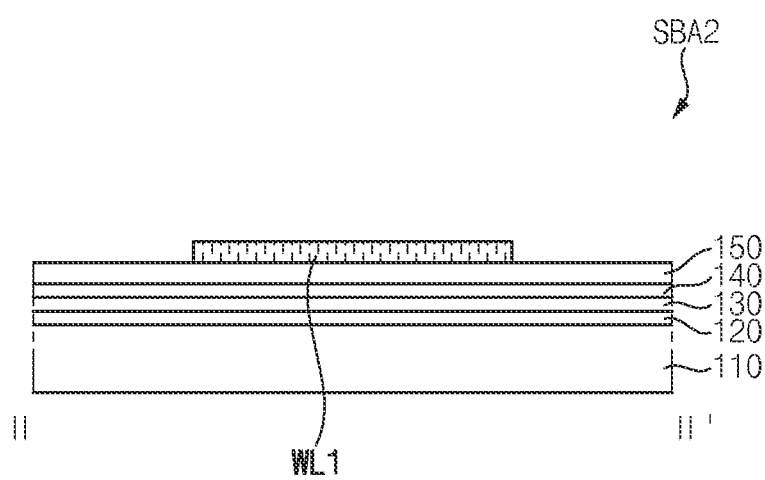

FIGS. 9A and 9B are cross-sectional views respectively illustrating a first area SBA1 and a second area SBA2 of the display device DD of FIG. 3. For example, FIG. 9A is a view illustrating a cross-section taken along line I-I' and FIG. 9B is a view illustrating a cross-section taken along line II-IF of FIG. 3. Hereinafter, FIGS. 9A and 9B may together be referred to as FIG. 9.

Referring to FIG. 9, the first conductive layer CL1 and the second conductive layer CL2 may be formed in the first area SBA1 of the pad area SBA. In an embodiment, the first conductive layer CL1 may be formed together with the gate metal pattern. Therefore, the first conductive layer CL1 may be disposed between the first insulating layer 130 and the second insulating layer 140. In an embodiment, the second conductive layer CL2 may be formed together with the first source metal pattern. Therefore, the second conductive layer CL2 may be disposed on the third insulating layer 150. The second conductive layer CL2 may electrically contact the first conductive layer CL1 exposed from the second insulating layer 140 and the third insulating layer 150.

The first wiring layer WL1 may be formed in the second area SBA2 of the pad area SBA. The first wiring layer WL1 may be integrally formed with the second conductive layer CL2. In other words, the first wiring layer WL1 may be formed together with the first source metal pattern. Accordingly, the first wiring layer WL1 may be disposed on the third insulating layer 150. In an embodiment, the first wiring layer WL1 may have a titanium/aluminum two-layer structure or a titanium/aluminum/titanium three-layer structure.

Figure 10:
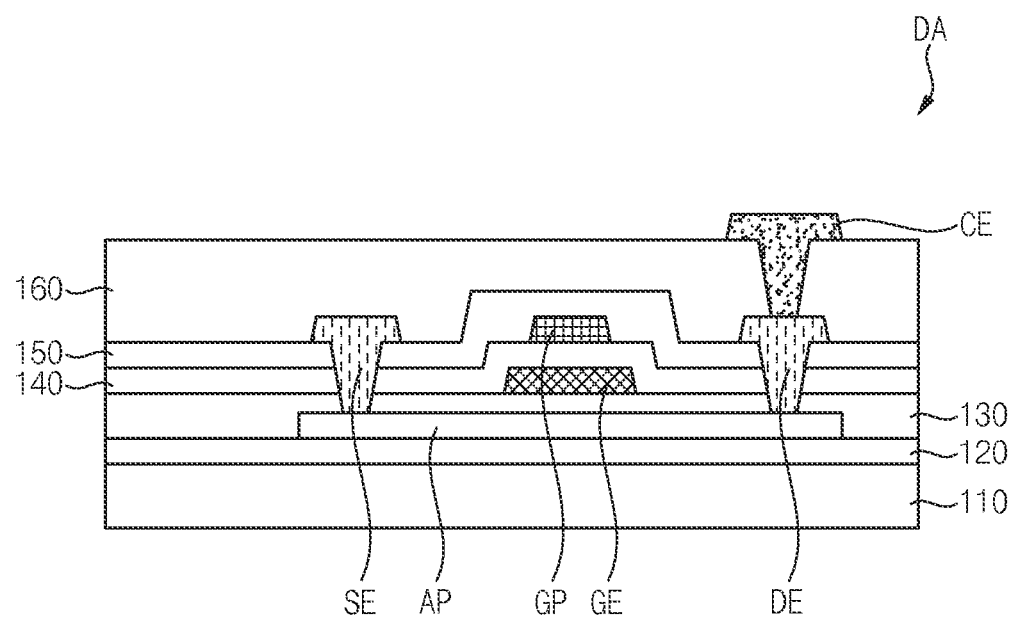

Referring to FIG. 10, the fourth insulating layer 160 covering the first source metal pattern may be formed. In an embodiment, the fourth insulating layer 160 may include an organic insulating material. Examples of materials that can be used as the fourth insulating layer 160 may include polyacrylic resin, polyimide resin, and acrylic resin. These may be used alone or in combination with each other.

Thereafter, the second source metal pattern may be formed on the fourth insulating layer 160, from a third source metal pattern layer. The second source metal pattern may include the connection electrode CE electrically contacting the drain electrode DE. For example, the connection electrode CE may pass through the fourth insulating layer 160 to contact the drain electrode DE, electrically. The second source metal pattern may further include the mesh power line for compensating for a voltage drop of current provided to the organic light emitting diode.

In an embodiment, the second source metal pattern may include a metal, an alloy, a metal oxide, or a transparent conductive material. Examples of materials that can be used as the second source metal pattern may include silver (Ag), an alloy containing silver, molybdenum (Mo), an alloy containing molybdenum, aluminum (Al), and aluminum containing Alloy, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), indium tin oxide (ITO), indium zinc oxide (IZO), or the like. These may be used alone or in combination with each other. In an embodiment, the second source metal pattern may have a titanium/aluminum two-layer structure or a titanium/aluminum/titanium three-layer structure.

Figure 11A:
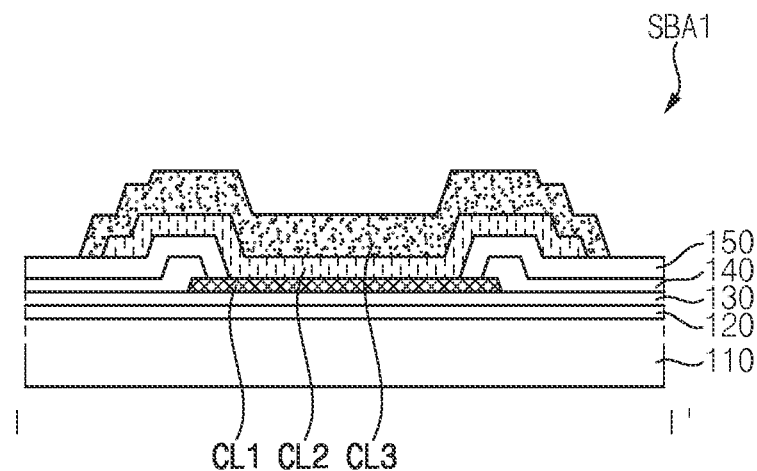
Figure 11B:
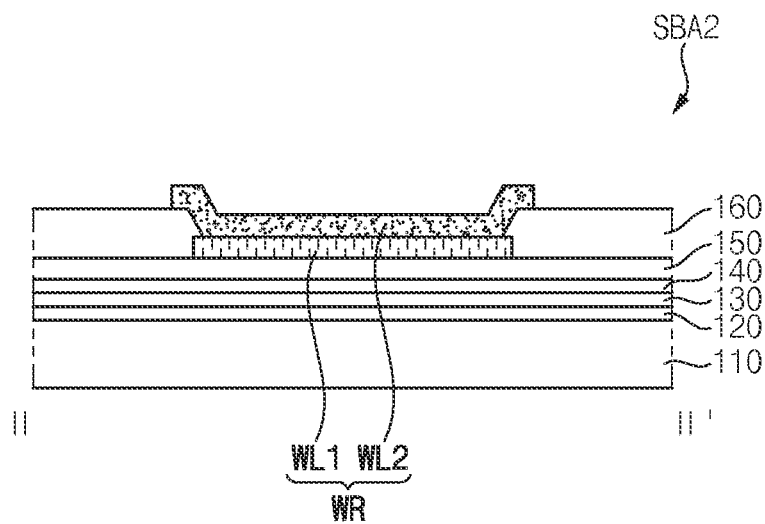

FIGS. 11A and 11B are cross-sectional views respectively illustrating a first area SBA1 and a second area SBA2 of the display device DD of FIG. 3. For example, FIG. 11A is a view illustrating a cross-section taken along line I-I' and FIG. 11B is a view illustrating a cross-section taken along line II-IF of FIG. 3. Hereinafter, FIGS. 11A and 11B may together be referred to as FIG. 11.

Referring to FIG. 11, the third conductive layer CL3 may be formed in the first area SBA1 of the pad area SBA. In an embodiment, the third conductive layer CL3 may be formed together with the second source metal pattern. The third conductive layer CL3 may be disposed on the second conductive layer CL2 and electrically contact the second conductive layer CL2.

The fourth insulating layer 160 may be formed in the second area SBA2 of the pad area SBA. The fourth insulating layer 160 may be disposed to cover both side portions of the first wiring layer WL1. The fourth insulating layer 160 may expose a central portion of the first wiring layer WL1. In an embodiment, the fourth insulating layer 160 may not be disposed in the first area SBA1, that is, may be excluded from the first area SBA1. For example, in the process of patterning the fourth insulating layer 160 in the display area DA and the second area SBA2, the entirety of the fourth insulating layer 160 in the first area SBA1 may be removed.

Thereafter, the second wiring layer WL2 may be formed in the second area SBA2 of the pad area SBA. The second wiring layer WL2 may be integrally formed with the third conductive layer CL3. In other words, the second wiring layer WL2 may be formed together with the second source metal pattern. For example, the second wiring layer WL2 may be disposed on the fourth insulating layer 160. The second wiring layer WL2 may electrically contact the first wiring layer WL1 exposed from the fourth insulating layer 160. In an embodiment, the second wiring layer WL2 may have a titanium/aluminum two-layer structure or a titanium/aluminum/titanium three-layer structure.

Figure 12:
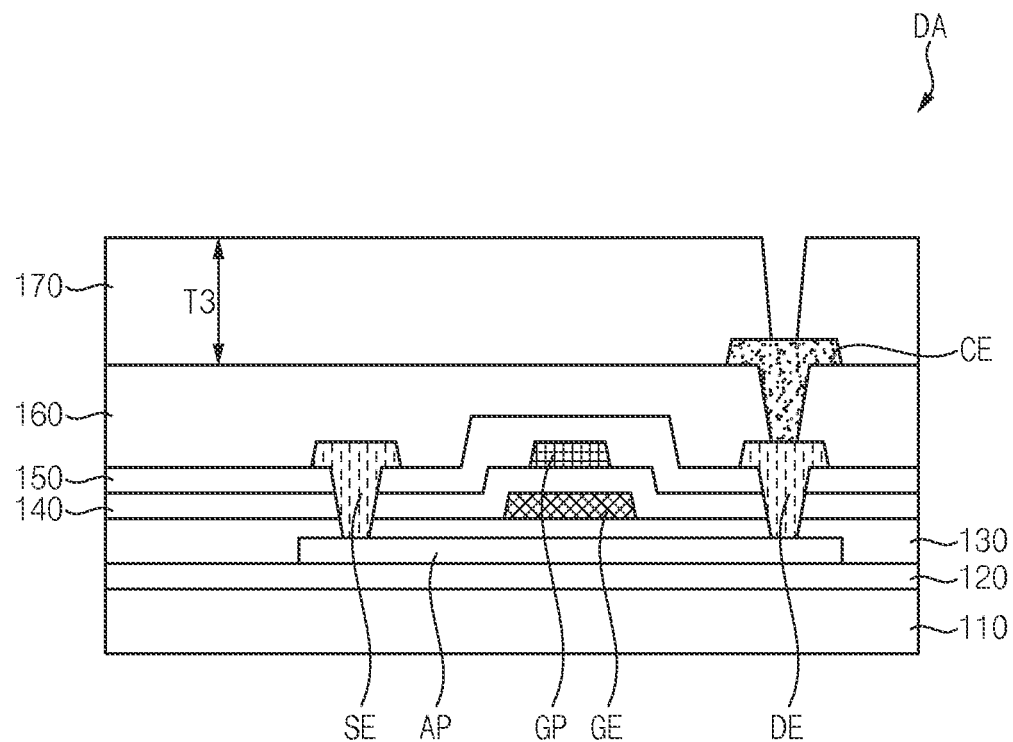

Referring to FIG. 12, the fifth insulating layer 170 may be formed in the display area DA. The fifth insulating layer 170 may be disposed on the fourth insulating layer 160 to cover the second source metal pattern including the connection electrode CE. A contact hole may be defined in the fifth insulating layer 170 to expose portions of the connection electrode CE and the third conductive layer CL3, to outside the fifth insulating layer 170.

Figure 13A:
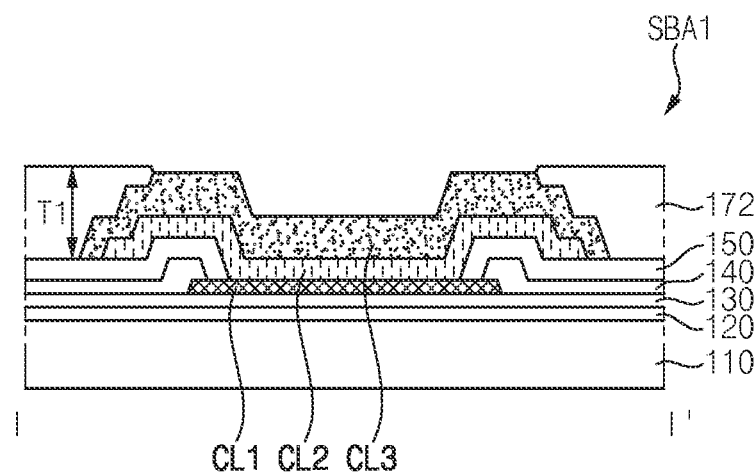
Figure 13B:
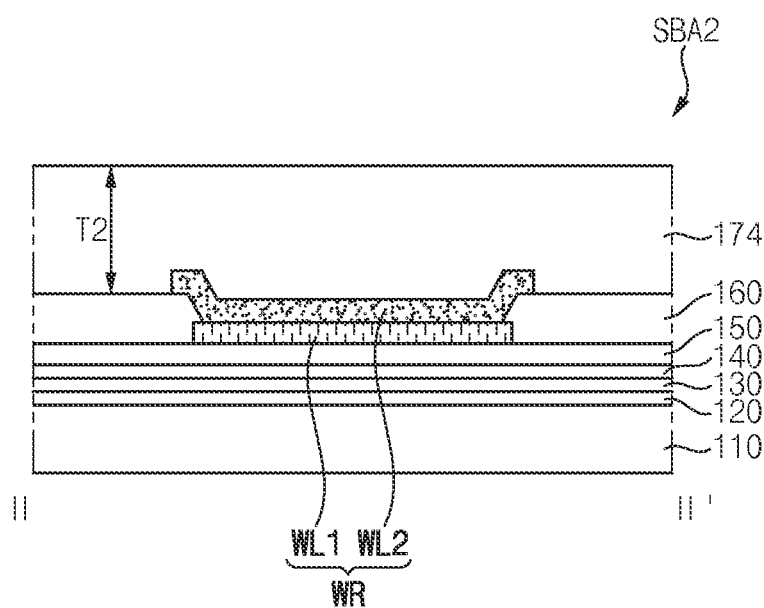

FIGS. 13A and 13B are cross-sectional views respectively illustrating a first area SBA1 and a second area SBA2 of the display device DD of FIG. 3. For example, FIG. 13A is a view illustrating a cross-section taken along line I-I' and FIG. 13B is a view illustrating a cross-section taken along line II-IF of FIG. 3. Hereinafter, FIGS. 13A and 13B may together be referred to as FIG. 13.

Referring to FIG. 13, the cladding layer 172 may be formed in the first area SBA1 of the pad area SBA, and the wiring insulating layer 174 may be formed in the second area SBA2 of the pad area SBA, as respective portions of a same insulating layer (e.g., the fifth insulating layer 170). The cladding layer 172 may be disposed on the third insulating layer 150 to cover at least a portion of the third conductive layer CL3 in the first area SBA1. The wiring insulating layer 174 may be disposed on the fourth insulating layer 160 to cover the second wiring layer WL2 in the second area SBA2.

In an embodiment, the fifth insulating layer 170, the cladding layer 172, and the wiring insulating layer 174 may be integrally formed. For example, the cladding layer 172 having the first thickness T1, the wiring insulating layer 174 having the second thickness T2, and the fifth insulating layer 170 having the third thickness T3 may be formed in the same process by applying a photoresist composition and irradiating light to areas corresponding to the fifth insulating layer 170, the cladding layer 172, and the wiring insulating layer 174 at different exposure amounts using a halftone mask or the like. In an embodiment, the second thickness T2 of the wiring insulating layer 174 may be greater than the first thickness T1 of the cladding layer 172. In this case, in an embodiment, the second thickness T2 of the wiring insulating layer 174 and the third thickness T3 of the fifth insulating layer 170 may be equal to each other.

In an embodiment, the fifth insulating layer 170, the cladding layer 172, and the wiring insulating layer 174 may include an organic insulating material. Examples of materials that can be used as the fifth insulating layer 170, the cladding layer 172, and the wiring insulating layer 174 may include polyacrylic resin, polyimide resin, and acrylic resin. These may be used alone or in combination with each other.

Figure 15A:
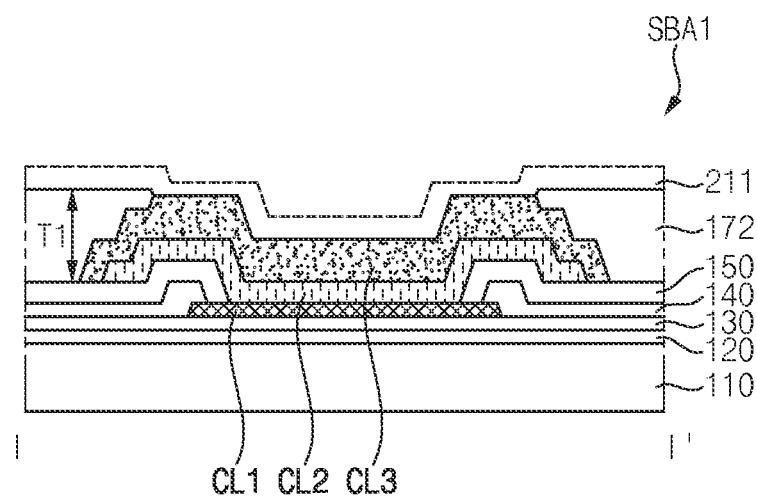
Figure 15B:
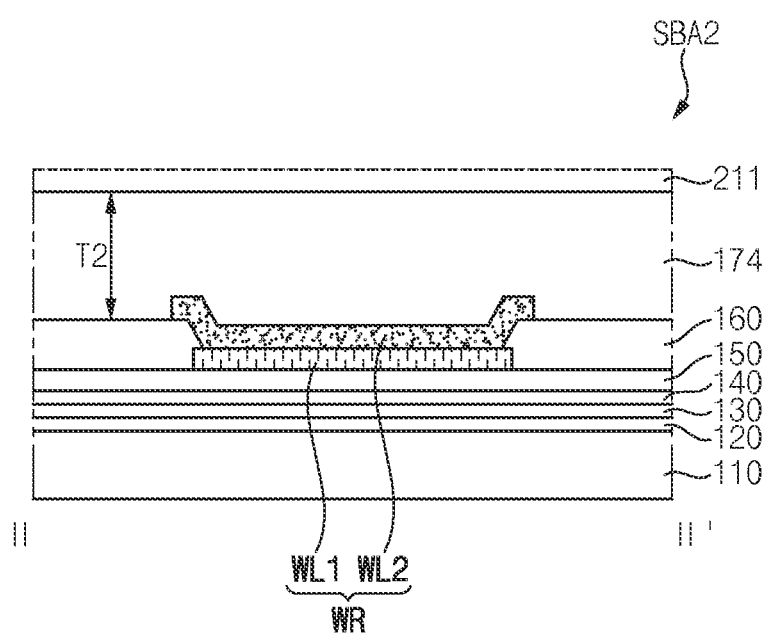

FIGS. 15A and 15B are cross-sectional views respectively illustrating a first area SBA1 and a second area SBA2 of the display device DD of FIG. 3. For example, FIG. 15A is a view illustrating a cross-section taken along line I-I' and FIG. 15B is a view illustrating a cross-section taken along line II-IF of FIG. 3. Hereinafter, FIGS. 15A and 15B may together be referred to as FIG. 15.

Figure 14:
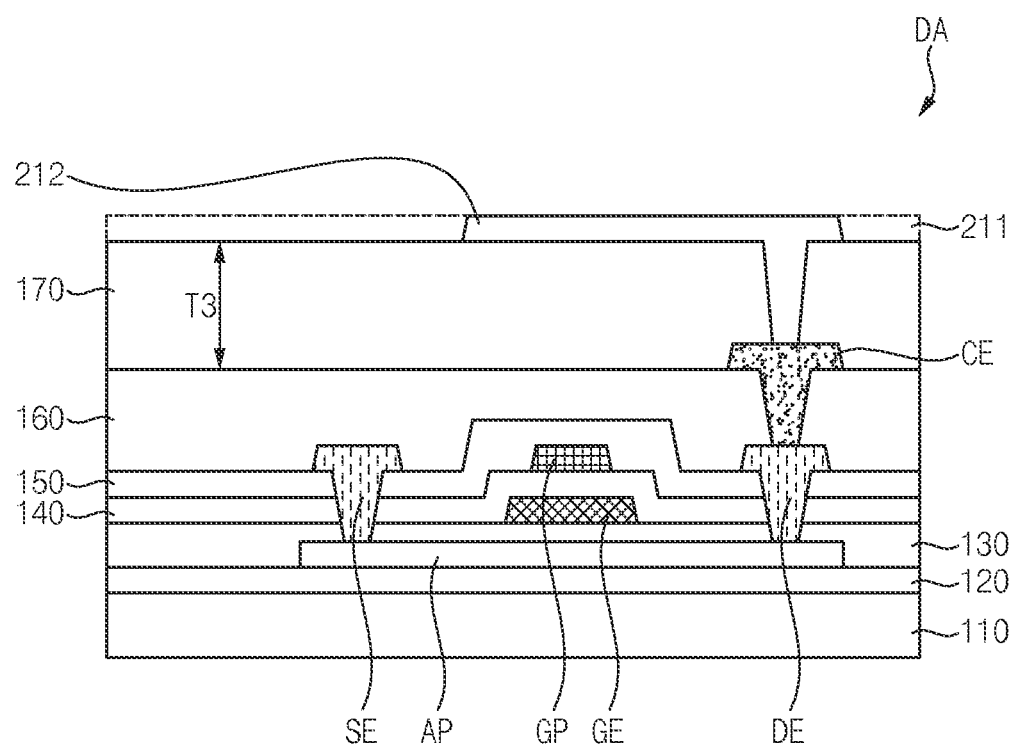

FIGS. 14 and 15, the first electrode 212 may be formed in the area DA by forming a lower electrode layer 211 on the fifth insulating layer 170, the cladding layer 172, and the wiring insulating layer 174, and patterning the lower electrode layer 211. In the pad area SBA, the entire lower electrode layer 211 may be removed (e.g., an entirety of the lower electrode material layer within the pad area SBA). Dotted line portions in FIGS. 14 and 15 indicate a removed portion of the lower electrode layer 211.

The lower electrode layer 211 may include a metal, an alloy, a metal oxide, a transparent conductive material, or the like. Examples of materials that can be used as the lower electrode layer 211 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

According to embodiments, the cladding layer 172 may cover end portions of the third conductive layer CL3 of the connection pad CP and the wiring insulating layer 174 may cover the connection wiring WR. Therefore, damage to the connection pad CP and the connection wire WL due to an etching process may be minimized or prevented. In addition, the cladding layer 172 and the wiring insulating layer 174 may be integrally formed, and the thickness of the wiring insulating layer 174 may be greater than that of the cladding layer 172. Accordingly, defects in a process of connecting the connection pad CP and the driving chip DC may be prevented, and damage to the connection wiring WR may be minimized or prevented. Accordingly, reliability of the display device and manufacturing process may be improved.

Figure 16:
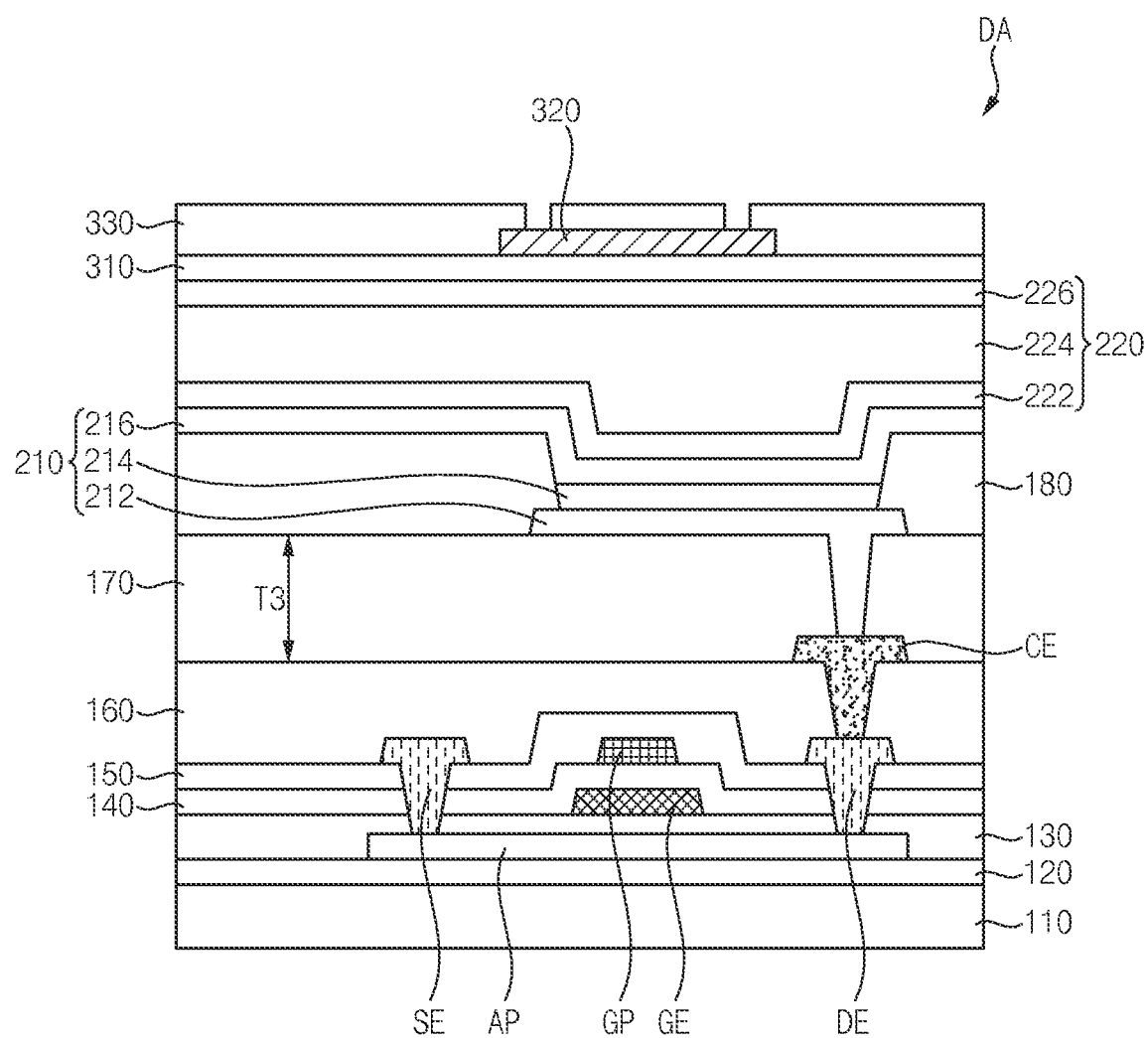

Referring to FIG. 16, the pixel defining layer 180 exposing the first electrode 212 to outside thereof, may be formed in the display area DA. The pixel defining layer 180 may have or define an opening exposing at least a portion of the first electrode 212 to outside the pixel defining layer 180. For example, the pixel defining layer 180 may include an organic insulating material.

Thereafter, the emission layer 214 may be formed on the first electrode 212. For example, the emission layer 214 may be disposed in the opening of the pixel defining layer 180. However, the invention is not necessarily limited thereto, and the emission layer 214 may extend over the upper surface of the pixel defining layer 180 or may continuously extend over the plurality of pixels on the display area DA.

In an embodiment, the emission layer 214 may have a multilayer structure in which a plurality of layers is stacked. For example, when the emission layer 214 generates blue light, the emission layer 214 may have a structure in which a plurality of blue organic light emitting layers is stacked.

In an embodiment, the emission layer 214 may have a multilayer structure in which a plurality of layers emitting light of different colors is stacked. For example, when the emission layer 214 generates blue light, the emission layer 214 may have a structure in which a plurality of blue organic light emitting layers and an organic light emitting layer emitting light of a color other than blue are stacked. For example, the emission layer 214 may have a structure in which three blue organic light emitting layers and one green organic light emitting layer are stacked.

Thereafter, the second electrode 216 may be formed on the emission layer 214. The second electrode 216 may continuously extend over the plurality of pixels on the display area DA. The first electrode 212 together with the emission layer 214 and the second electrode 216 may define a light emitting device 210.

Referring again to FIG. 16, the encapsulation layer 220 may be formed on the second electrode 216. It may include at least one inorganic encapsulation layer and at least one organic encapsulation layer. In an embodiment, the first inorganic encapsulation layer 222 may be formed on the second electrode 216, and the organic encapsulation layer 224 disposed on the first inorganic encapsulation layer 222 and the second inorganic encapsulation layer 226 disposed on the organic encapsulation layer 224 may be formed. In the pad area SBA, the pixel defining layer 180, the emission layer 214, the second electrode 216, and the encapsulation layer 220 may not be formed or may be removed after being formed.

In an embodiment, the touch sensing part may be formed on the encapsulation layer 220.

For example, the first touch insulating layer 310 may be formed on the encapsulation layer 220. The first sensing conductive pattern may be formed on the first touch insulating layer 310. The first sensing conductive pattern may include the bridge pattern 320. The second touch insulating layer 330 may be formed on the first sensing conductive pattern. The via hole exposing the bridge pattern 320 to outside the second touch insulating layer 330 may be formed in the second touch insulating layer 330.

Figure 17A:
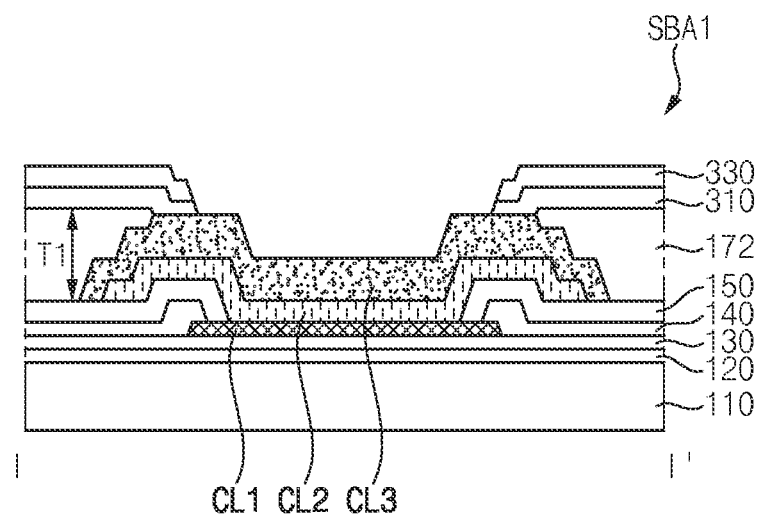
Figure 17B:
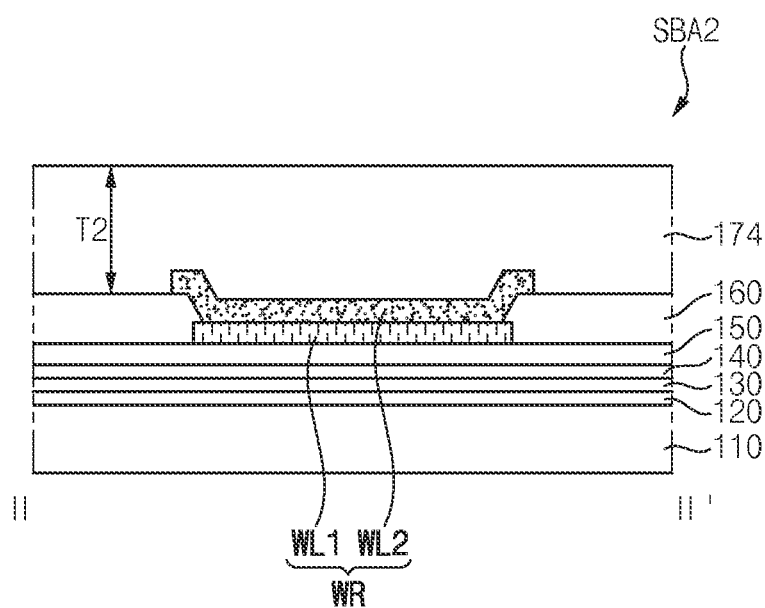

FIGS. 17A and 17B are cross-sectional views respectively illustrating a first area SBA1 and a second area SBA2 of the display device DD of FIG. 3. For example, FIG. 17A is a view illustrating a cross-section taken along line I-I' and FIG. 17B is a view illustrating a cross-section taken along line II-IF of FIG. 3. Hereinafter, FIGS. 17A and 17B may together be referred to as FIG. 17.

Referring to FIG. 17, the passivation layer (labeled as 310 and 330 in FIG. 17) may be formed on the third conductive layer CL3 and the cladding layer 172 in the first area SBA1 of the pad area SBA. For example, the passivation layer may include a lower passivation layer including the same material as the first touch insulating layer 310 and an upper passivation layer including the same material as the second touch insulating layer 330. The passivation layer may have a via hole exposing the third conductive layer CL3 to outside the passivation layer.

Thereafter, as shown in FIGS. 5 and 7, the second sensing conductive pattern may be formed in the display area DA, and the fourth conductive layer CL4 of the first connection pad CP1 may be formed in the first area SBA1 of the pad area SBA, from a fourth metal pattern layer. In an embodiment, the fourth conductive layer CL4 may be formed together with the second sensing conductive pattern. The fourth conductive layer CL4 may electrically contact the third conductive layer CL3 by penetrating the passivation layer.

Each of the first touch insulating layer 310 and the second touch insulating layer 330 may include an inorganic insulating material. Examples of materials that can be used as each of the first touch insulating layer 310 and the second touch insulating layer 330 may include silicon oxide (SiOx), silicon nitride (SiNx), and silicon oxynitride (SiON). These may be used alone or in combination with each other.

Each of the first sensing conductive pattern and the second sensing conductive pattern may include a metal, an alloy, a metal oxide, or a transparent conductive material. Examples of materials that can be used as each of the first sensing conductive pattern and the second sensing conductive pattern may include silver (Ag), an alloy containing silver, molybdenum (Mo), an alloy containing molybdenum, Aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

Figure 19A:
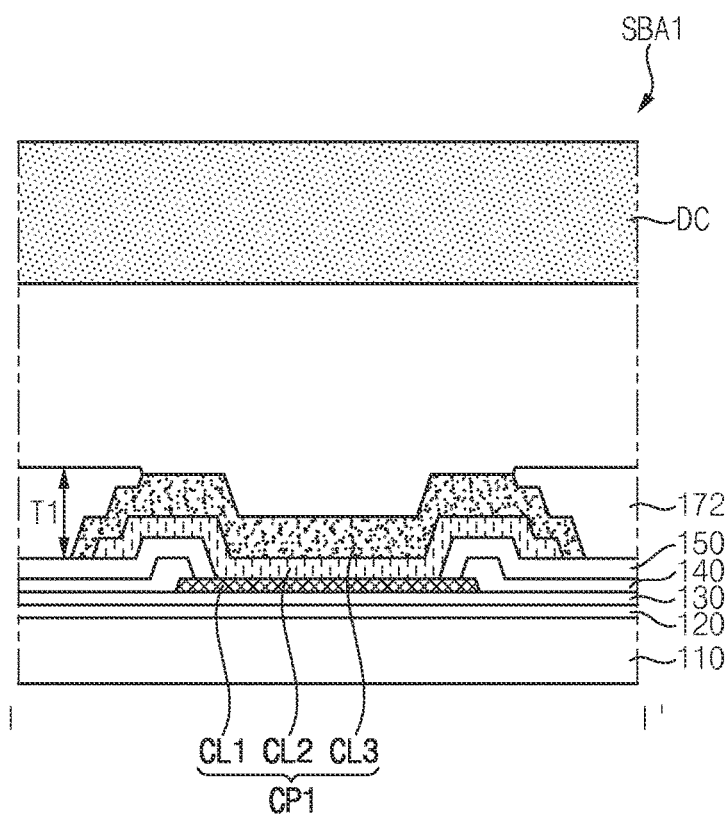
Figure 19B:
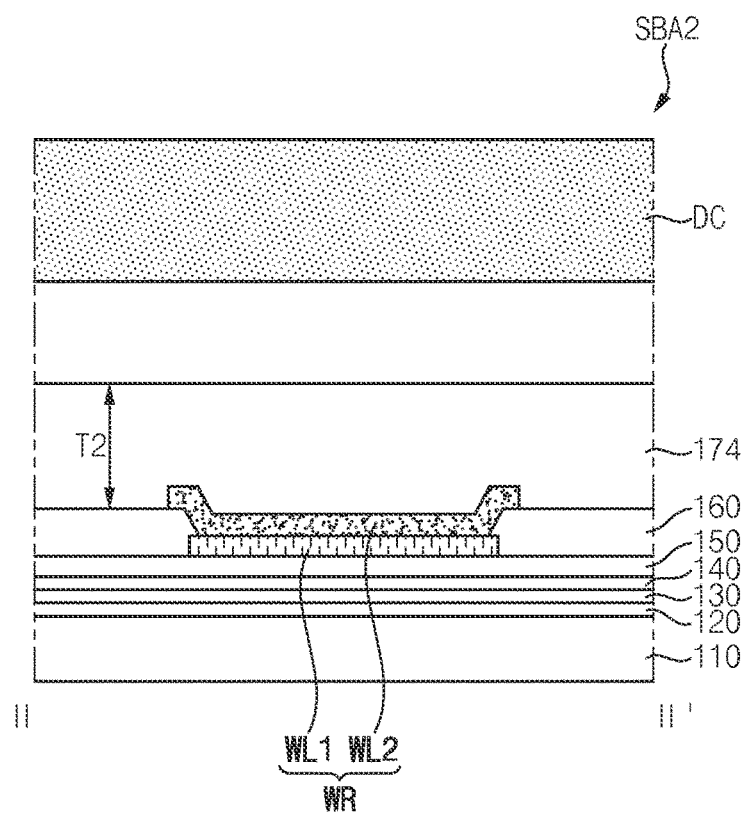

Thereafter, the driving chip DC may be bonded to the pad area SBA. In an embodiment, the driving chip DC may be bonded to the pad area SBA by thermal compression bonding, ultrasonic welding, or the like, and electrically connected to the connection pads CP through the conductive bonding member BP. Referring to FIGS. 7A and 4, or example, the unlabeled layer between the fourth conductive layer CL4 and the driving chip DC may represent a portion of the conductive bonding layer BP, without being limited thereto. That is, the first connection pad CP1 is exposed to outside the stacked structure including layers 110 through CL4, for connection with a component such as the driving chip DC. The stacked structure including layers 110 through CL4 may define a display panel of the display device DD, without being limited thereto. In an embodiment, stacked structure including a FIGS. 19A and 19B are cross-sectional views respectively illustrating a first area SBA1 and a second area SBA2 of the display device DD of FIG. 3. For example, FIG. 19A is a view illustrating a cross-section taken along line I-I' and FIG. 19B is a view illustrating a cross-section taken along line II-IF of FIG. 3. Hereinafter, FIGS. 19A and 19B may together be referred to as FIG. 19.

Figure 18:
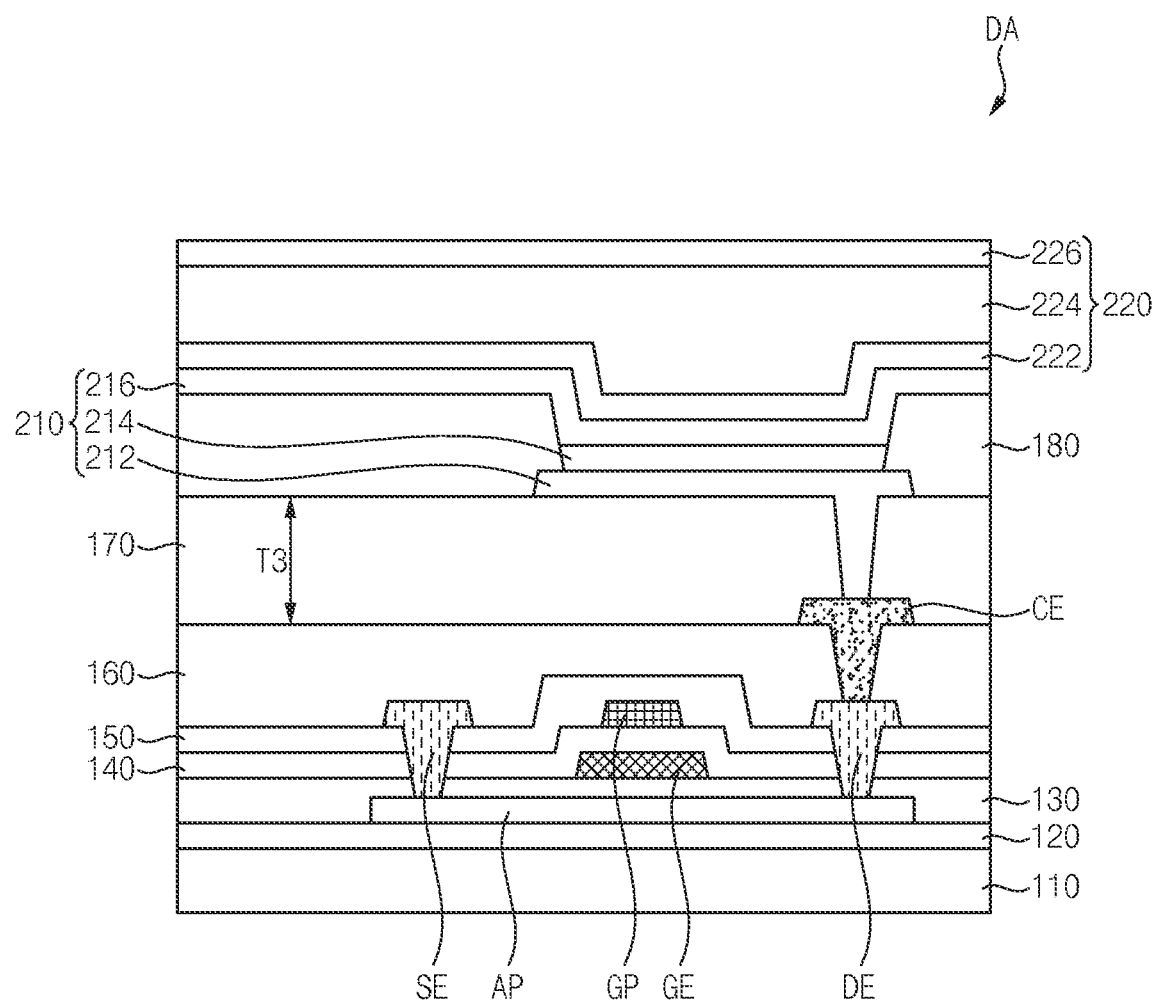
FIGS. 18, 19A and 19B are views illustrating a display device according to an embodiment.

FIGS. 18 and 19 are views illustrating the display device DD according to an embodiment. For example, FIG. 18 may correspond to the cross-sectional view of FIG. 5 and the view of FIG. 19 may correspond to the cross-sectional views of FIG. 7.

In an embodiment, in the display device DD, the touch sensing part may be omitted. In this case, the fourth conductive layer CL4 of the first connection pads CP1 may be omitted, and the third conductive layer CL3 may form the uppermost layer of the output pad (e.g., the first connection pad CP1) and/or the input pad (e.g., the second connection pad CP2). In addition, the passivation layer as one or more of layer 310 and 330, may be omitted in the first area SBA1 of the pad area SBA.

Figure 21A:
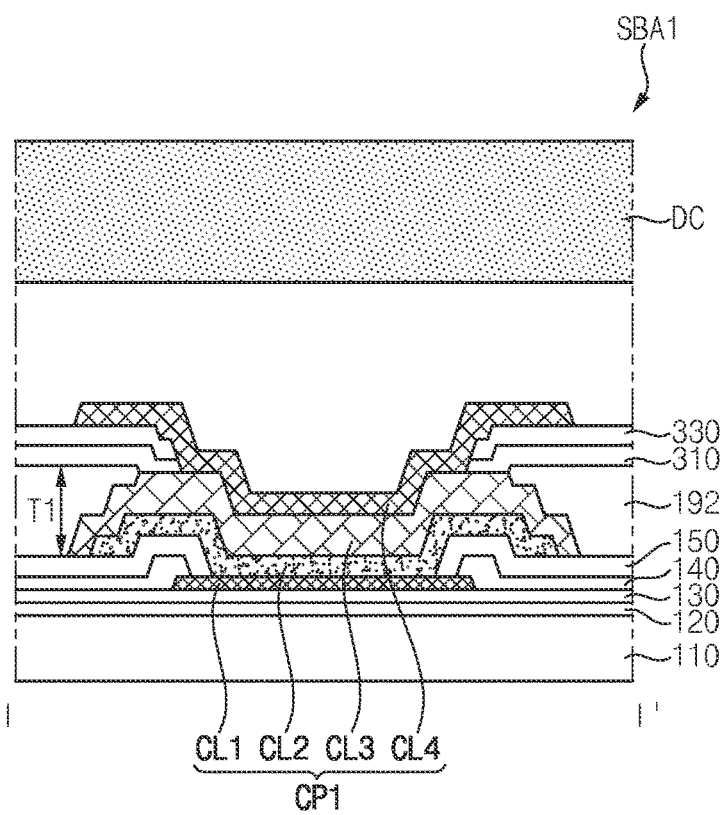
Figure 21B:
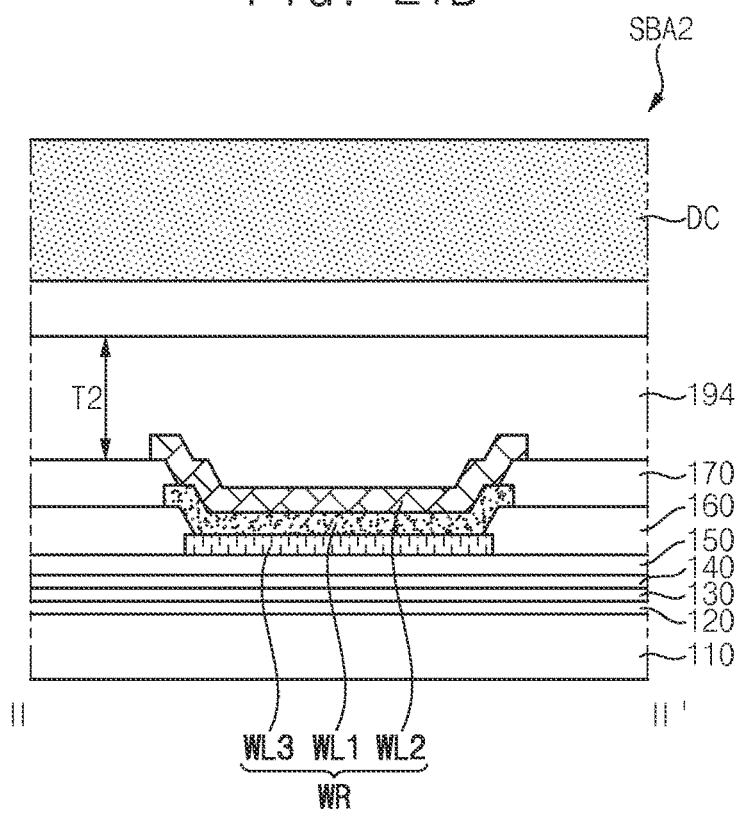

FIGS. 21A and 21B are cross-sectional views respectively illustrating a first area SBA1 and a second area SBA2 of the display device DD of FIG. 3. For example, FIG. 21A is a view illustrating a cross-section taken along line I-I' and FIG. 21B is a view illustrating a cross-section taken along line II-IF of FIG. 3. Hereinafter, FIGS. 21A and 21B may together be referred to as FIG. 21.

Figure 20:
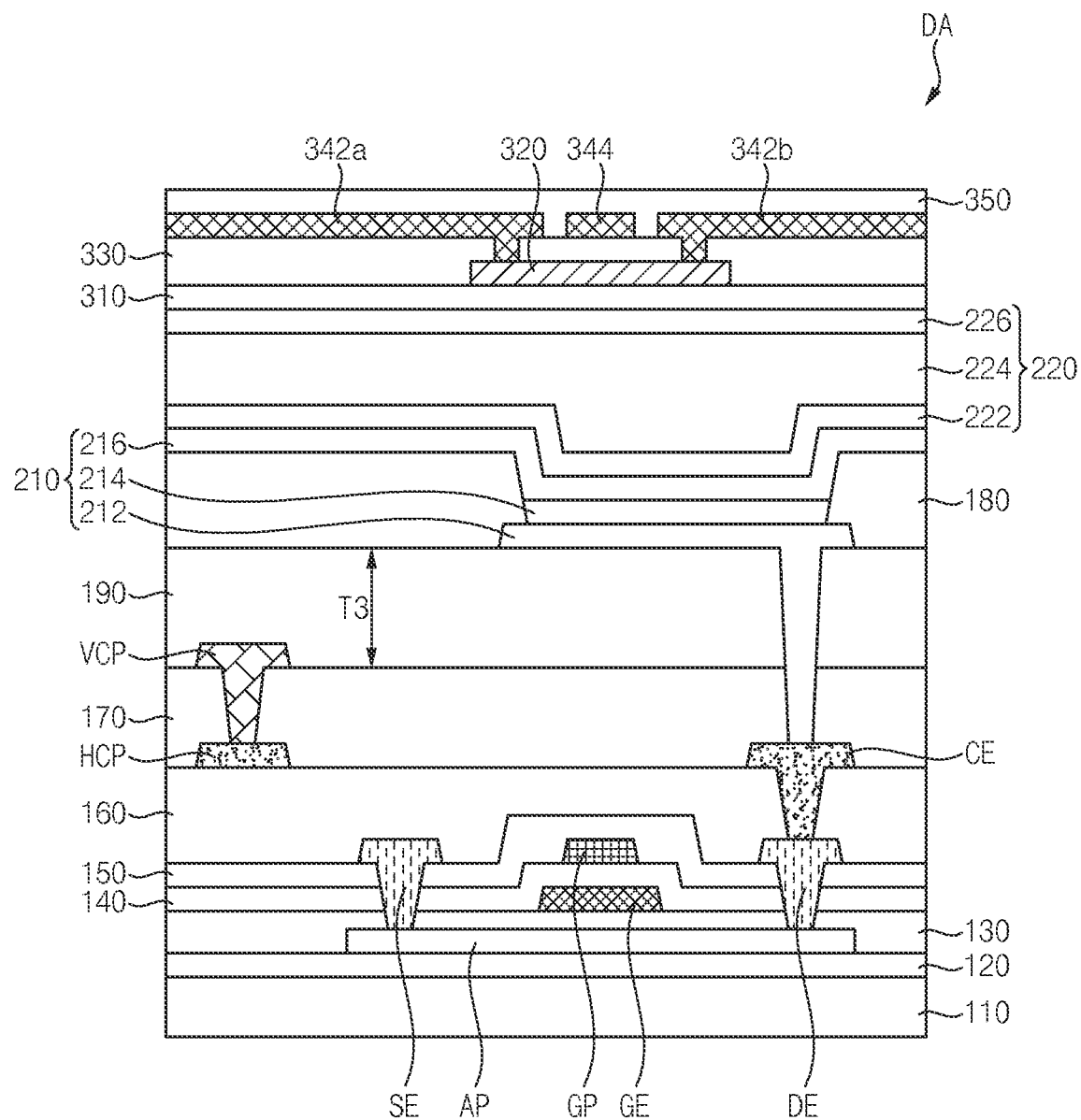
FIGS. 20, 21A and 21B are views illustrating a display device according to an embodiment.

FIGS. 20 and 21 are views illustrating the display device DD according to an embodiment. For example, FIG. 20 may correspond to the cross-sectional view of FIG. 5 and FIG. 21 may correspond to the cross-sectional view of FIG. 7.

In an embodiment, a second source metal pattern of the display device DD may further include a horizontal connection pattern HCP. In other words, the horizontal connection pattern HCP may be formed together with the connection electrode CE.

In an embodiment, a third source metal pattern as a portion of a third source metal pattern layer including a vertical connection pattern VCP may be disposed on the fifth insulating layer 170. The vertical connection pattern VCP may electrically contact the horizontal connection pattern HCP. The sixth insulating layer 190 may be disposed on the third source metal pattern. The sixth insulating layer 190 may be referred to as a third via insulating layer. In an embodiment, the sixth insulating layer 190 may include an organic insulating material. Examples of materials that can be used as the sixth insulating layer 190 may include polyacrylic resin, polyimide resin, and acrylic resin. These may be used alone or in combination with each other.

A data voltage may be applied to the horizontal connection pattern HCP and the vertical connection pattern VCP. In other words, the horizontal connection pattern HCP and the vertical connection pattern VCP may function as a bypass wiring for transferring the data voltage to the data wiring. Accordingly, the fan-out wiring may not be formed in the display device DD. Thus, a dead space of the display device DD may be reduced.

In an embodiment, the second conductive layer CL2 may include the same material as the second source metal pattern of the display area DA. In other words, the second conductive layer CL2 may be formed together with the second source metal pattern.

In an embodiment, the third conductive layer CL3 may include the same material as the third source metal pattern of the display area DA. In other words, the third conductive layer CL3 may be formed together with the third source metal pattern. The third conductive layer CL3 may be disposed on the second conductive layer CL2 and electrically contact the second conductive layer CL2.

In an embodiment, a cladding layer 192 covering at least a portion of the third conductive layer CL3 may be disposed in the first area SBA1. In an embodiment, the cladding layer 192 may cover a side surface of the third conductive layer CL3.

In an embodiment, a connection wiring WR may include a first wiring layer WL1, a second wiring layer WL2, and a third wiring layer WL3.

In an embodiment, the third wiring layer WL3 may include the same material as the first source metal pattern. For example, the third wiring layer WL3 may be disposed on the third insulating layer 150. In the second area SBA2, the fourth insulating layer 160 may be disposed to cover both side portions of the third wiring layer WL3. The fourth insulating layer 160 may expose a central portion of the third wiring layer WL3. In an embodiment, the third wiring layer WL3 may be omitted.

In an embodiment, the first wiring layer WL1 may be integrally formed with the second conductive layer CL2. In other words, the first wiring layer WL1 may include the same material as the second conductive layer CL2. In other words, the first wiring layer WL1 may include the same material as the second source metal pattern of the display area DA. For example, the first wiring layer WL1 may be disposed on the fourth insulating layer 160. In the second area SBA2, the fourth insulating layer 160 may be disposed to cover both side portions of the first wiring layer WL1. The fourth insulating layer 160 may expose a central portion of the first wiring layer WL1.

In an embodiment, the second wiring layer WL2 may be integrally formed with the third conductive layer CL3. In other words, the second wiring layer WL2 may include the same material as the third conductive layer CL3. In other words, the second wiring layer WL2 may include the same material as the third source metal pattern of the display area DA. For example, the second wiring layer WL2 may be disposed on the fifth insulating layer 170. The second wiring layer WL2 may electrically contact the first wiring layer WL1 exposed from the fifth insulating layer 170.

In an embodiment, a wiring insulating layer 194 covering the second wiring layer WL2 may be formed in the second area SBA2.

In an embodiment, the sixth insulating layer 190, the cladding layer 192, and the wiring insulating layer 194 may be integrally formed. For example, the cladding layer 192 having a first thickness T1, the wiring insulating layer 194 having a second thickness T2, and the sixth insulating layer 190 having a third thickness T3 may be formed in the same process by applying a photoresist composition and irradiating light to areas corresponding to the sixth insulating layer 190, the cladding layer 192, and the wiring insulating layer 194 at different exposure amounts using a halftone mask or the like. In an embodiment, the second thickness T2 of the wiring insulating layer 194 may be greater than the first thickness T1 of the cladding layer 192. In this case, in an embodiment, the second thickness T2 of the wiring insulating layer 194 and the third thickness T3 of the sixth insulating layer 190 may be equal to each other.

In an embodiment, the sixth insulating layer 190, the cladding layer 192, and the wiring insulating layer 194 may include an organic insulating material. Examples of materials that can be used for the sixth insulating layer 190, the cladding layer 192, and the wiring insulating layer 194 may include polyacrylic resin, polyimide resin, and acrylic resin. These may be used alone or in combination with each other.

According to embodiments, the display device DD may include a cladding layer 172 (or 192) and a wiring insulating layer 174 (or 194) formed in a pad area SBA, the respective cladding layer may cover at least a portion of a conductive layer of a connection pad CP (e.g., an input pad or an output pad), and the respective wiring insulating layer may cover a wiring layer WR of a connection wiring. Accordingly, damage to the connection pad and the connection wiring due to an etching process may be minimized or prevented. In addition, the cladding layer and the wiring insulating layer may be integrally formed, and the thickness of the wiring insulating layer may be greater than the thickness of the cladding layer. Accordingly, defects in a process of connecting the connection pad and the integrated circuit may be prevented, and damage to the connection wiring may be minimized or prevented. Accordingly, the reliability of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a display area including:
        a light emitting device,
        a driving element which is connected to the light emitting device and drives the light emitting device,
        an encapsulation layer covering the light emitting device, and
        a touch sensing layer on the encapsulation layer;
    a pad area adjacent to the display area, the pad area including:
        a connection pad comprising a first conductive layer, a second conductive layer on the first conductive layer, a third conductive layer on the second conductive layer, and a fourth conductive layer on the third conductive layer, and
        a connection wiring which is electrically connected to the connection pad, the connection wiring including a first wiring layer and a second wiring layer which is on the first wiring layer; and
    an insulating layer in the pad area, the insulating layer defining:
        a cladding layer covering a side surface of the third conductive layer of the connection pad, the cladding layer having a first thickness; and
        a wiring insulating layer covering the second wiring layer of the connection wiring, the wiring insulating layer having a second thickness greater than the first thickness of the cladding layer.

2. The display device of claim 1, wherein the display area further includes:
    the driving element including:
        a gate electrode of a gate metal pattern layer;

a drain electrode of a first source metal pattern layer; and a connection electrode of a second source metal pattern layer, the connection electrode connecting the drain electrode and the light emitting device to each other, and the touch sensing layer including a sensing electrode of a sensing conductive pattern layer.

3. The display device of claim 2, wherein
the insulating layer is further in the display area and further defines a via insulating layer on the connection electrode of the driving element, and
the via insulating layer has a third thickness which is equal to the second thickness of the wiring insulating layer.

4. The display device of claim 2, wherein
the gate metal pattern layer includes the first conductive layer of the connection pad,
the first source metal pattern layer includes the second conductive layer of the connection pad,
the second source metal pattern layer includes the third conductive layer of the connection pad, and
the sensing conductive pattern layer includes the fourth conductive layer of the connection pad.

5. The display device of claim 2, wherein
the touch sensing layer includes:
 a first touch insulating layer;
 a first sensing conductive pattern on the first touch insulating layer;
 a second touch insulating layer covering the first sensing conductive pattern; and
 a second sensing conductive pattern on the second touch insulating layer, and
the fourth conductive layer of the connection pad and the second sensing conductive pattern are respective portions of a same material layer.

6. The display device of claim 5, further comprising a passivation layer covering the cladding layer,
wherein
a layer among the first touch insulating layer and the second touch insulating layer is in the display area and in the pad area, and
a portion of the layer defines the passivation layer.

7. The display device of claim 1, wherein
the first wiring layer of the connection wiring and the second conductive layer of the connection pad are respective portions of a same conductive material layer, and
the second wiring layer of the connection wiring and the third conductive layer of the connection pad are respective portions of a same conductive material layer.

8. The display device of claim 1, wherein the display area further includes:
the driving element including:
 a gate electrode of a gate metal pattern layer;
 a drain electrode of a first source metal pattern layer;
 a connection electrode of a second source metal pattern layer, the connection electrode connecting the drain electrode and the light emitting device to each other,
 a horizontal connection pattern of the second source metal pattern layer, to which a data voltage is applied; and
 a vertical connection pattern of a third source metal pattern layer, the vertical connection pattern electrically connected to the horizontal connection pattern, and
the touch sensing layer including a sensing electrode of a sensing conductive pattern layer.

9. The display device of claim 8, wherein
the insulating layer is further in the display area and further defines a via insulating layer on the third source metal pattern layer, and
the via insulating layer has a third thickness which is equal to the second thickness of the wiring insulating layer.

10. The display device of claim 8, wherein
the gate metal pattern layer includes the first conductive layer of the connection pad,
the second source metal pattern layer includes the second conductive layer of the connection pad,
the third source metal pattern layer includes the third conductive layer of the connection pad, and
the sensing conductive pattern layer includes the fourth conductive layer of the connection pad.

11. The display device of claim 10, wherein
the connection wiring further includes a third wiring layer facing the second wiring layer with the first wiring layer therebetween, and
the first source metal pattern layer includes the third wiring layer.

12. A display device comprising:
a display area including a pixel;
a pad area adjacent to the display area, the pad area including:
 a connection pad comprising a first conductive layer, a second conductive layer on the first conductive layer, a third conductive layer on the second conductive layer, and a fourth conductive layer on the third conductive layer, and
 a connection wiring which is electrically connected to the connection pad, the connection wiring including a first wiring layer and a second wiring layer which is on the first wiring layer; and
an insulating layer in the pad area, the insulating layer defining:
 a cladding layer covering a side surface of the third conductive layer of the connection pad, the cladding layer having a first thickness; and
 a wiring insulating layer covering the second wiring layer of the connection wiring, the wiring insulating layer having a second thickness greater than the first thickness of the cladding layer.

13. The display device of claim 12, wherein
the pixel includes:
 a light emitting device, and
 a driving element which is electrically connected to the light emitting device and drives the light emitting device, the driving element including a gate electrode, a drain electrode, and a connection electrode connecting the drain electrode and the light emitting device to each other,
a gate metal pattern layer includes the gate electrode of the driving element and the first conductive layer of the connection pad,
a first source metal pattern layer includes the drain electrode of the driving element and the second conductive layer of the connection pad, and
a second source metal pattern layer includes the connection electrode of the driving element and the third conductive layer of the connection pad.

14. The display device of claim 13, wherein
the insulating layer is further in the display area and further defines a via insulating layer on the second source metal pattern layer, and the via insulating layer has a third thickness which is equal to the second thickness of the wiring insulating layer.

15. The display device of claim 13, wherein
the first source metal pattern layer further includes the first wiring layer of the connection wiring, and
the second source metal pattern layer further includes the second wiring layer of the connection wiring.

16. A method of providing a display device, the method comprising:
providing a substrate including a display area and a pad area which is adjacent to the display area, the pad area including a connection pad and a connection wiring which is connected to the connection pad; and
in the pad area:
providing a first metal pattern layer on the substrate, the first metal pattern layer defining a first conductive layer of the connection pad;
providing a second metal pattern layer on the first metal pattern layer, the second metal pattern layer defining a second conductive layer of the connection pad which is electrically connected to the first conductive layer, and a first wiring layer of the connection wiring which is connected to the second conductive layer;
providing a third metal pattern layer on the second metal pattern layer, the third metal pattern layer defining a third conductive layer of the connection pad which is electrically connected to the second conductive layer, and a second wiring layer of the connection wiring which is connected to the third conductive layer;
providing an insulating layer on the third metal pattern layer, the insulating layer defining:
a cladding layer covering a side surface of the third conductive layer of the connection pad, the cladding layer having a first thickness, and
a wiring insulating layer covering the second wiring layer of the connection wiring, the wiring insulating layer having a second thickness greater than the first thickness of the cladding layer; and
providing a fourth metal pattern layer on the insulating layer, the fourth metal pattern layer defining a fourth conductive layer of the connection pad which is electrically connected to the third conductive layer.

17. The method of claim 16, further comprising providing in the display area:
a light emitting device, and
a driving element which is electrically connected to the light emitting device and drives the light emitting device, the driving element including a gate electrode, a drain electrode and a connection electrode which connects the drain electrode to the light emitting device,
wherein
the providing of the first metal pattern layer further defines the gate electrode,
the providing of the second metal pattern layer further defines the drain electrode, and
the providing of the third metal pattern layer further defines the connection electrode.

18. The method of claim 17, further comprising providing in the display area:
an encapsulation layer which covers the light emitting device, and
a touch sensing layer on the encapsulation layer and including a sensing conductive pattern,
wherein the providing of the fourth metal pattern layer further defines the sensing conductive pattern.

19. The method of claim 17, further comprising providing the insulating layer in the display area,
wherein
the insulating layer further defines a via insulating layer covering the second source metal pattern layer, and
the via insulating layer has a third thickness which is equal to the second thickness of the wiring insulating layer.

20. The method of claim 19, wherein the providing of the cladding layer, the wiring insulating layer and the via insulating layer includes using a halftone mask.

* * * * *